(12) United States Patent
Song

(10) Patent No.: US 12,376,248 B2
(45) Date of Patent: Jul. 29, 2025

(54) DISPLAY DEVICE

(71) Applicant: LG ELECTRONICS INC., Seoul (KR)

(72) Inventor: Insu Song, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 243 days.

(21) Appl. No.: 18/202,821

(22) Filed: May 26, 2023

(65) Prior Publication Data

US 2023/0397352 A1 Dec. 7, 2023

(30) Foreign Application Priority Data

Jun. 3, 2022 (KR) .......................... 10-2022-0067923

(51) Int. Cl.
*H05K 5/02* (2006.01)
*H10K 77/10* (2023.01)
*H10K 102/00* (2023.01)

(52) U.S. Cl.
CPC .......... *H05K 5/0226* (2013.01); *H10K 77/111* (2023.02); *H10K 2102/311* (2023.02)

(58) Field of Classification Search
CPC .... G06F 1/1601; G06F 1/1652; G06F 1/1612; G06F 1/1605; G06F 1/1641; G06F 1/1681; G06F 1/181; G06F 1/20; G06F 1/16; G06F 1/1607; H05K 5/02; H05K 5/0017; H05K 5/0217; H05K 5/0226; H05K 5/03
See application file for complete search history.

(56) References Cited

U.S. PATENT DOCUMENTS 4,958,521 A * 9/1990 Morimoto .............. G01N 19/04
73/827
10,310,311 B2 * 6/2019 Jung ..................... G06F 1/1601
(Continued)

FOREIGN PATENT DOCUMENTS

EP 2816440 12/2014
EP 2940552 11/2015
(Continued)

OTHER PUBLICATIONS

European Patent Office Application Serial No. 23176069.5, Search Report dated Nov. 8, 2023, 10 pages.
(Continued)

*Primary Examiner* — Abhishek M Rathod
(74) *Attorney, Agent, or Firm* — LEE, HONG, DEGERMAN, KANG & WAIMEY

(57) ABSTRACT

A display device is provided. The display device includes: a flexible display panel; a flexible plate disposed at a rear of the display panel and coupled to the display panel; a driving module disposed at a rear of the plate and including a moving block that moves in a reciprocating motion on the lead screw by rotation of the lead screw; wings elongated with a first end coupled to the moving block and a second end coupled to the rear of the plate, and having pivot shafts disposed adjacent to the first end between the first end and the second end; wing brackets connected with the pivot shafts and fixed to the rear of the plate; and an elastic member having a first side supported by the wing brackets and a second side supported by the wings to push the wings in one of moving directions of the moving block.

13 Claims, 29 Drawing Sheets

(56) References Cited

U.S. PATENT DOCUMENTS

| | | | | |
|---|---|---|---|---|
| 11,749,138 B2* | 9/2023 | Park | ........................ | G09F 9/301 |
| | | | | 361/679.01 |
| 11,805,610 B2* | 10/2023 | Pyo | ........................ | G06F 1/1652 |
| 2014/0376163 A1* | 12/2014 | Song | ........................ | G09F 9/301 |
| | | | | 361/679.01 |
| 2015/0145837 A1* | 5/2015 | Park | ................... | H04N 21/41265 |
| | | | | 345/184 |
| 2017/0124937 A1* | 5/2017 | Kim | ........................ | G09G 3/2096 |
| 2020/0333846 A1* | 10/2020 | Jan | ........................ | G06F 1/1652 |

FOREIGN PATENT DOCUMENTS

| | | |
|---|---|---|
| EP | 3016098 | 5/2016 |
| EP | 3249640 | 11/2017 |
| KR | 101128875 | 3/2012 |
| KR | 20150081228 | 7/2015 |
| KR | 1020150092428 | 8/2015 |
| KR | 1020150122511 | 11/2015 |
| KR | 1020150134825 | 12/2015 |

OTHER PUBLICATIONS

Korean Intellectual Property Office Application No. 10-2022-0067923, Notice of Allowance dated Nov. 30, 2024, 2 pages.

* cited by examiner

DISPLAY DEVICE

CROSS-REFERENCE TO RELATED APPLICATION(S)

Pursuant to 35 U.S.C. § 119(a), this application claims the benefit of earlier filing date and right of priority to Korean Patent Application No. 10-2022-0067923, filed on Jun. 3, 2022, the contents of which are hereby incorporated by reference herein in its entirety.

BACKGROUND OF THE INVENTION

1. Field of the Invention

The following description relates to a display device, and more particularly to a display device capable of changing a curvature of a display panel.

2. Description of the Related Art

With the development of the information society, there have been growing demands for various types of display devices, and in order to meet these demands, various display devices, such as a liquid crystal display (LCD), an electroluminescent display (ELD), a vacuum fluorescent display (VFD), an organic light emitting diode (OLED) panel, etc., have been studied and used recently.

Among these display devices, the OLED panel may display images as the panel includes a self light-emitting organic layer deposited on a substrate on which transparent electrodes are formed. The OLED panel is thin and flexible, and active research has been conducted on the structural characteristics of a display device including the OLED panel.

SUMMARY OF THE INVENTION

It is an objective of the present disclosure to solve the above and other problems.

It is another objective of the present disclosure to provide a structure capable of freely changing a curvature of a display panel.

It is yet another objective of the present disclosure to provide a mechanism capable of freely changing a curvature of a display.

In accordance with an aspect of the present disclosure, the above and other objectives can be accomplished by providing a display device including: a flexible display panel; a flexible plate disposed at a rear of the display panel and coupled to the display panel; a driving module disposed at a rear of the plate and including a moving block that moves in a reciprocating motion on the lead screw by rotation of the lead screw; wings elongated with a first end coupled to the moving block and a second end coupled to the rear of the plate, and having pivot shafts disposed adjacent to the first end between the first end and the second end; wing brackets connected with the pivot shafts and fixed to the rear of the plate; and an elastic member having a first side supported by the wing brackets and a second side supported by the wings to push the wings in one of moving directions of the moving block.

Effects of the Invention

According to at least one of the embodiments of the present disclosure, a structure capable of freely changing a curvature of a display panel may be provided.

According to at least one of the embodiments of the present disclosure, a mechanism capable of freely changing a curvature of a display may be provided.

Further scope of applicability of the present disclosure will become apparent from the detailed description given hereinafter. However, it should be understood that the detailed description and specific examples, while indicating preferred embodiments of the present disclosure, are given by illustration only, since various changes and modifications within the spirit and scope of the present disclosure will become apparent to those skilled in the art from this detailed description.

DETAILED DESCRIPTION OF THE PREFERRED EMBODIMENTS

Figure 1:
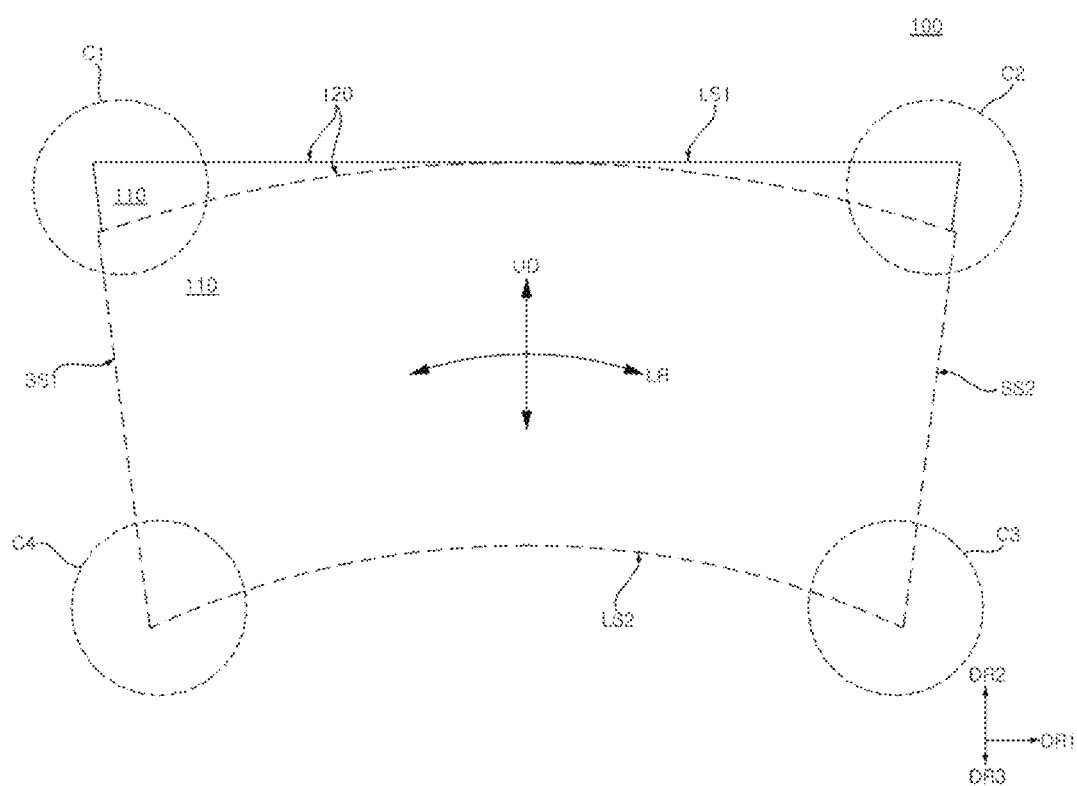
FIGS. 1 to 29 are diagrams illustrating examples of a display device according to embodiments of the present disclosure.

Hereinafter, the present disclosure will be described in detail with reference to the accompanying drawings, in which the same reference numerals are used throughout the drawings to designate the same or similar components, and a redundant description thereof will be omitted.

The terms "module" and "unit" for elements used in the following description are given simply in view of the ease of the description, and do not have a distinguishing meaning or role. It will be noted that a detailed description of known arts will be omitted if it is determined that the detailed description of the known arts can obscure the embodiments of the invention. Further, the accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that, although the terms first, second, etc., may be used herein to describe various elements, these elements should not be limited by these terms. These terms are only used to distinguish one element from another.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As used herein, the singular forms are intended to include the plural forms as well, unless the context clearly indicates otherwise.

It should be understood that the terms "comprise", "include", "have", etc. when used in this specification, specify the presence of stated features, integers, steps, operations, elements, components, or combinations of them but do not preclude the presence or addition of one or more other features, integers, steps, operations, elements, components, or combinations thereof.

Hereinafter, a display panel will be described by using an Organic Light Emitting Diode (OLED) as an example, but a display panel applicable to the present disclosure is not limited to the OLED panel.

In addition, in the following description, the display device may include a first long side LS1, a second long side LS2 opposite the first long side LS1, a first short side SS1 adjacent to one end of each of the first long side LS1 and the second long side LS2, and a second short side SS2 opposite the first short side SS1.

Here, an area of the first short side SS1 may be referred to as a first side area; an area of the second short side SS2 may be referred to as a second side area opposite to the first side area; an area of the first long side LS1 may be referred to as a third side area adjacent to the first side area and the second side area and disposed between the first side area and the second side area; and an area of the second long side LS2 may be referred to as a fourth side area adjacent to the first side area and the second side area, disposed between the first side area and the second side area, and opposite to the third side area.

For convenience of explanation, it is illustrated and described that the first and second long sides LS1 and LS2 are longer than the first and second short sides SS1 and SS2, but it is also possible that the lengths of the first and second long sides LS1 and LS2 may be approximately equal to the lengths of the first and second short sides SS1 and SS2.

In the following description, a first direction DR1 may be a direction parallel to the long sides LS1 and LS2 of the display device, and a second direction DR2 may be a direction parallel to the short sides SS1 and SS2 of the display device. A third direction DR3 may be a direction perpendicular to the first direction DR1 and/or the second direction DR2.

The first direction DR1 and the second direction DR2 may be collectively referred to as a horizontal direction. Further, the third direction DR3 may be referred to as a vertical direction.

A side or a surface, on which the display device displays an image, may be referred to as a front side or a front surface. When the display device displays an image, a side or a surface, at which the image cannot be observed, may be referred to as a rear side or a rear surface. When the display device is viewed from the front side or the front surface, the first long side LS1 may be referred to as an upper side or an upper surface, and the second long side LS2 may be referred to as a lower side or a lower surface. Likewise, the first short side SS1 may be referred to as a left side or a left surface, and the second short side SS2 may be referred to as a right side or a right surface.

The first long side LS1, the second long side LS2, the first short side SS1, and the second short side SS2 may be referred to as edges of the display device. Further, positions where the first long side LS1, the second long side LS2, the first short side SS1, and the second short side SS2 meet each other may be referred to as corners. For example, a position where the first long side LS1 and the first short side SS1 meet each other may be referred to as a first corner C1; a position where the first long side LS1 and the second short side SS2 meet each other may be referred to as a second corner C2; a position where the second short side SS2 and the second long side LS2 meet each other may be referred to as a third corner C3; and a position where the second long side LS2 and the first short side SS1 meet each other may be referred to as a fourth corner C4.

Here, a direction from the first short side SS1 to the second short side SS2 or a direction from the second short side SS2 to the first short side SS1 may be referred to as a left-right direction LR. A direction from the first long side LS1 to the second long side LS2 or a direction from the second long side LS2 to the first long side LS1 may be referred to as an up-down direction UD.

Referring to FIG. 1, a display panel 110 may be coupled to a plate 120. The plate 120 may be flexible. The plate 120 may be referred to as a flexible plate 120, a frame 120, or a module cover 120. The display panel 110 may be disposed on a front side or a front surface of the plate 120. The display panel 110 may be flexible. For example, the display panel 110 may be an OLED panel.

The display panel 110 may be provided on a front surface of a display device 100 and may display an image. The display panel 110 may divide the image into a plurality of pixels and may output the image while controlling color, brightness, and chroma of the respective pixels. The display panel 110 may generate light corresponding to red, green, or blue color in response to a control signal.

The display device 100 may have a variable curvature. The left and right sides of the display device 100 may move forward. For example, when an image is viewed from the front side of the display device 100, the display device 100 may be curved concavely. In this case, the plate 120 may be curved with the same curvature as the display panel 110. Alternatively, the display panel 110 may be curved corresponding to the curvature of the plate 120.

Figure 2:
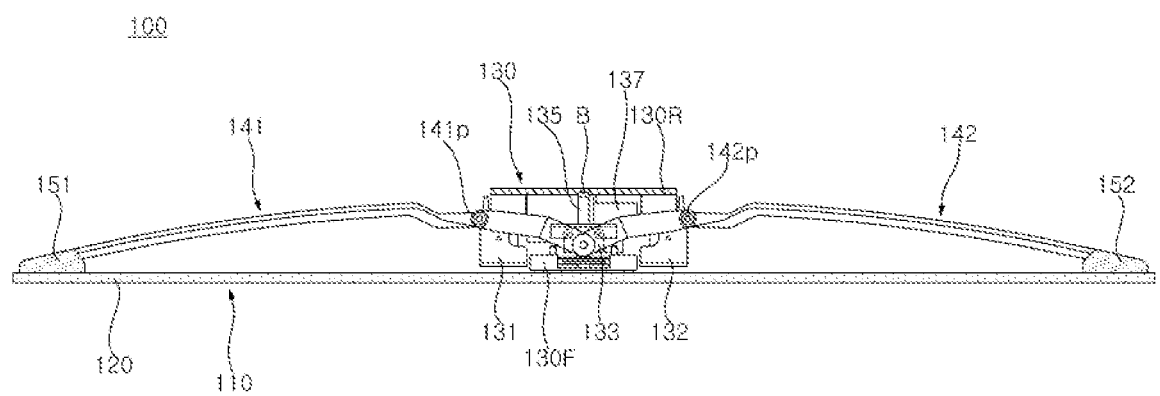
Figure 3:
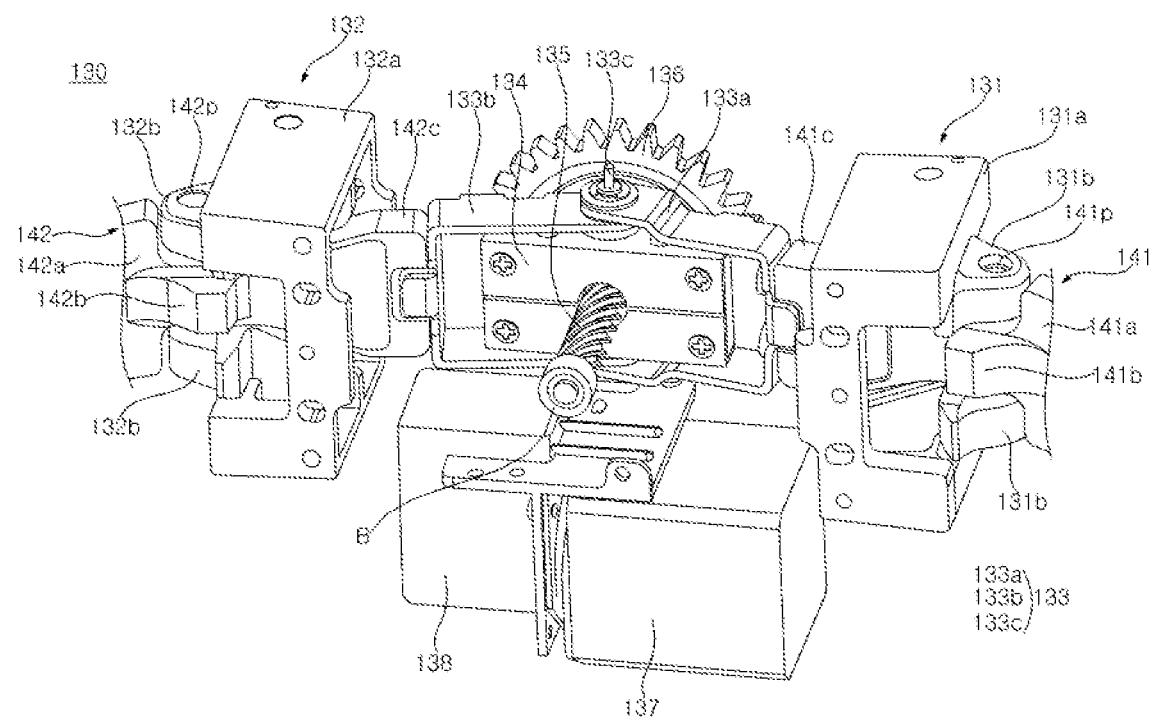

Referring to FIGS. 2 and 3, the plate 120 may be coupled to the rear of the display panel 110. The plate 120 may support the display panel 110 at the rear of the display panel 110. The plate 120 may have a shape corresponding to the display panel 110.

A driving module 130 may be coupled to the rear of the plate 120. A front bracket 130F, a rear bracket 130R, and wing brackets 131 and 132 may be disposed at the rear of the plate 120. The front bracket 130F may be coupled or fixed to a rear surface of the plate 120. The rear bracket 130R may be disposed at the rear of the front bracket 130F, may be spaced apart from the front bracket 130F, and may face the front bracket 130F.

The wing brackets 131 and 132 may include bracket frames 131a and 132a and wing holders 131b and 132b. The bracket frames 131a and 132a may be in the shape of a rectangular box. The wing holders 131b and 132b may be formed on one side of the bracket frames 131a and 132a. The wing holders 131b and 132b may protrude from one surface of the bracket frames 131a and 132a. The wing holders 131b and 132b may form a pair. The pair of wing holders 131b and 132b may be disposed opposite each other.

There may be a plurality of wing brackets 131 and 132. The plurality of wing brackets 131 and 132 may include a first wing bracket 131 and a second wing bracket 132. The first wing bracket 131 may be coupled or fixed to the front bracket 130F and/or the rear bracket 130R and may be disposed opposite the second wing bracket 132 with respect to the front bracket 130F. The second wing bracket 132 may also be coupled or fixed to the front bracket 130F and/or the rear bracket 130R.

Wings 141 and 142 may include blades 141a and 142a, necks 141b and 142b, and levers 141c and 142c. For example, the wings 141 and 142 may be made of metal. In another example, the wings 141 and 142 may be made of an aluminum alloy. The blades 141a and 142a may be elongated plates and may include ribs for providing rigidity. The levers 141c and 142c and the necks 141b and 142b may be formed at one end of the blades 141a and 142a. The necks 141b and 142b, disposed between the levers 141c and 142c and the blades 141a and 142a, may connect the levers 141c and 142c and the blades 141a and 142a. A width of the necks 141b and 142b may be smaller than a width of the levers 141c and 142c, and a width of the levers 141c and 142c may be smaller than a width of the blades 141a and 142a. Pivot shafts 141p and 142p may be formed in the necks 141b and 142b. The pivot shafts 141p and 142p may be inserted into the wing holders 131b and 132b. The wings 141 and 142 may pivot about the pivot shafts 141p and 142p and the wing holders 131b and 132b.

The first wing 141 may be rotatably or pivotally coupled to the first wing bracket 131, and the second wing 142 may be rotatably or pivotally coupled to the second wing bracket 132. The first wing 141 may be symmetric to the second wing 142 with respect to a driving unit 130.

Sliding mounts 151 and 152 may be coupled or fixed to a rear side or a rear surface of the plate 120. A first sliding mount 151 may be disposed adjacent to a left side of the plate 120, and a second sliding mount 152 may be disposed adjacent to a right side of the plate 120. A distal end of the first wing 141 may be movably coupled to the first sliding mount 151. A distal end of the second wing 142 may be movably coupled to the second sliding mount 152.

A flip frame 133 may be disposed between the lever 141c of the first wing 141 and the lever 142c of the second wing 142 and may be coupled to the levers 141c and 142c. For example, the flip frame 133 may be made of metal. The flip frame 133 may include a first frame 133a and a second frame 133b. For example, the first frame 133a may have a U-shape, and the second frame 133b may have a U-shape. The first frame 133a may be pivotally connected with the second frame 133b. A pivot pin 133c may pass through the first frame 133a and the second frame 133b to connect the first frame 133a and the second frame 133b. The first frame 133a may pivot with respect to the second frame 133b, and the second frame 133b may pivot with respect to the first frame 133a. The first frame 133a may be fixed or coupled to the lever 141c of the first wing 141, and the second frame 133b may be fixed or coupled to the lever 142c of the second wing 142.

A moving block 134 may be disposed inside the flip frame 133. The moving block 134 may be disposed between the first frame 133a and the second frame 133b of the flip frame 133.

A lead screw 135 may be inserted into the moving block 134. The moving block 134 may move on the lead screw 135 by rotation of the lead screw 135. During rotation and reverse rotation of the lead screw 135, the moving block 134 may perform a reciprocating motion on the lead screw 135.

The lead screw 135 may be coupled to the driving gear 136 and may rotate together with the driving gear 136. The driving gear 136 may rotate while facing a rear surface of the plate 120 (see FIG. 2). The lead screw 135 may be a rotating shaft of the driving gear 136. A bearing B may be coupled to one end and/or both ends of the lead screw 135. The lead screw 135 may rotate with the one end being inserted into a front bearing B and the other end being inserted into a rear bearing B. For example, the lead screw 135 may be press-fit into the front bearing B and the rear bearing B.

A motor 137 may be disposed under the moving block 134. The motor 137 may provide torque. A gear box 138 may transmit the torque of the motor 137 to the driving gear 136.

Figure 4:
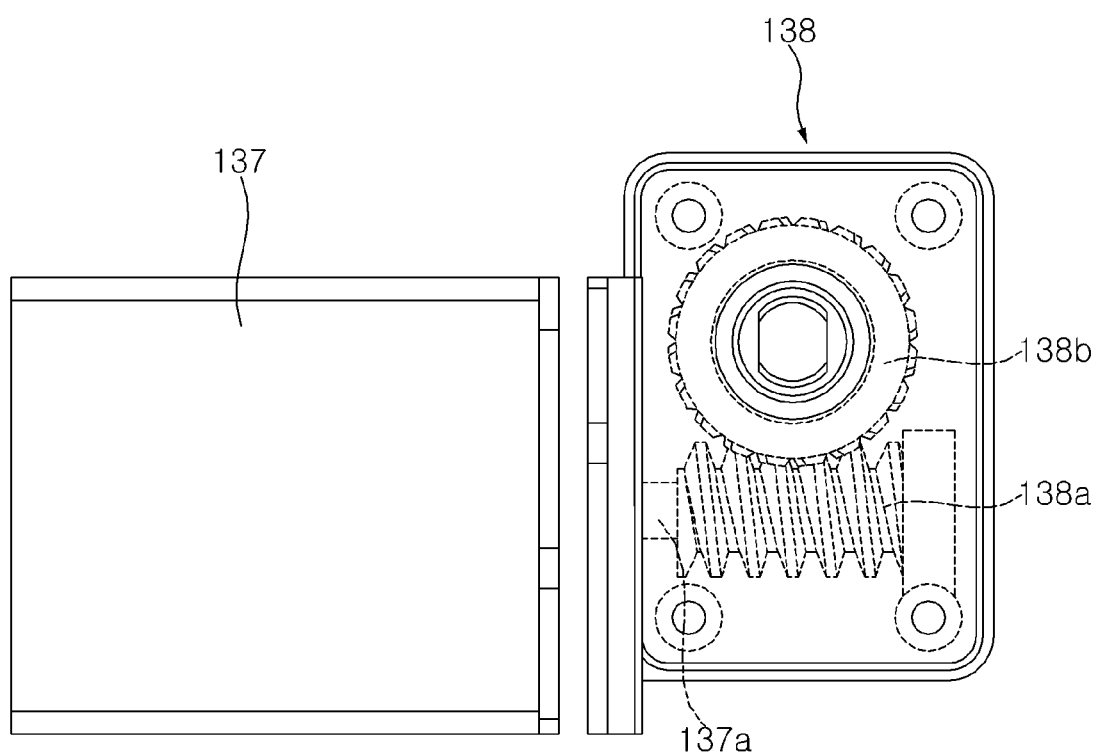
Figure 5:
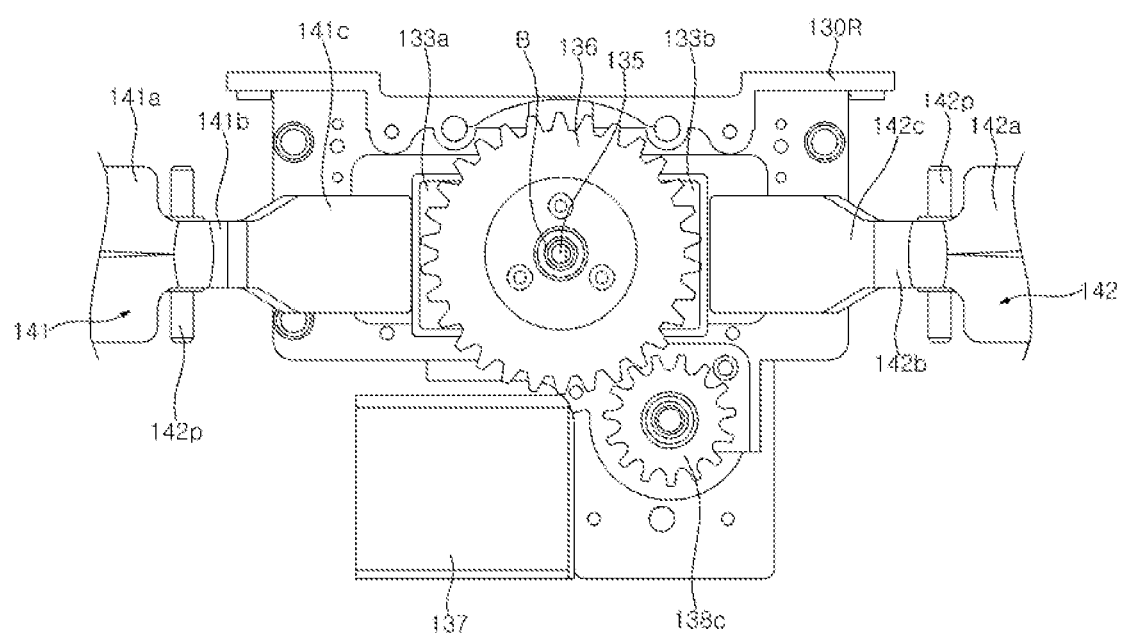

Referring to FIGS. 4 and 5, a first gear 138a may be fixed to a rotating shaft 137a of the motor 137 to rotate together with the rotating shaft 137a of the motor 137. For example, the first gear 138a may be a worm. A second gear 138b may be engaged with the first gear 138a. For example, the second gear 138 may be a worm gear.

The first gear 138a and the second gear 138b may be disposed in the gear box 138. A transmission gear 138c may be disposed outside the gear box 138. The transmission gear 138c may be fixed to the rotating shaft 137a of the second gear 138b and may rotate together with the second gear 138b. The transmission gear 138c may be engaged with the driving gear 136.

The lead screw 135 may be a rotating shaft of the driving gear 136. The driving gear 136 may be fixed to the lead screw 135. The driving gear 136 may be coupled to the lead screw 135 by a pin.

Figure 6:
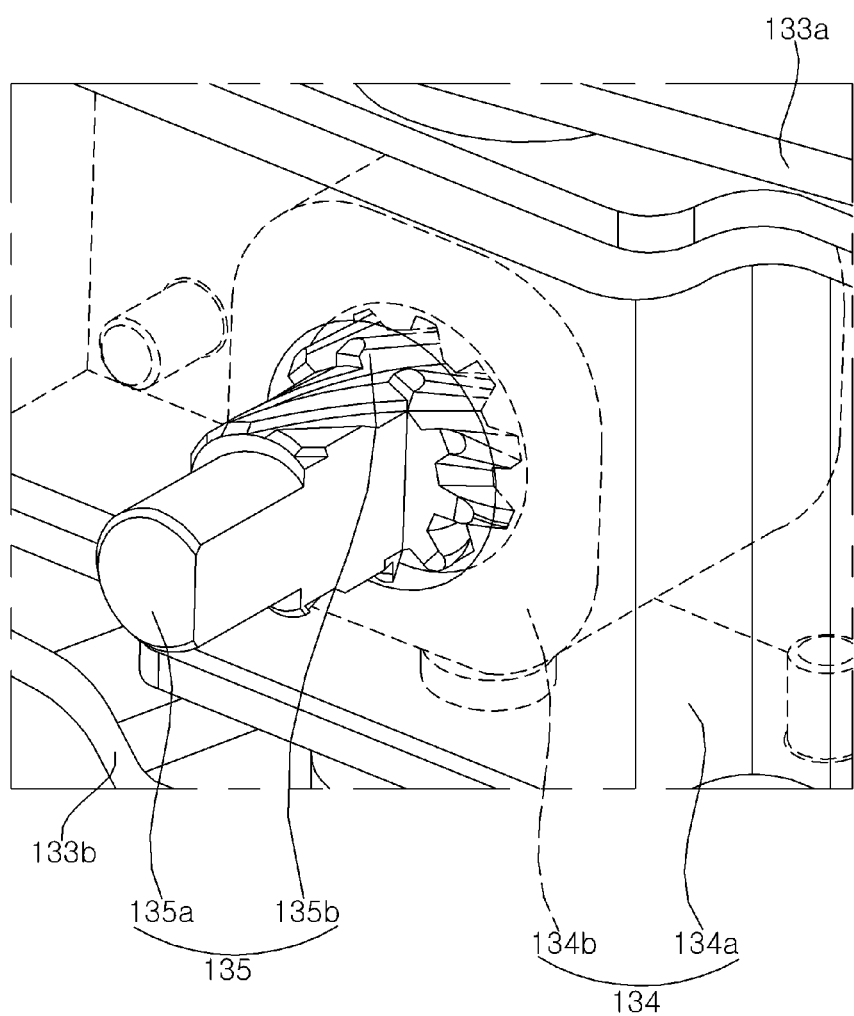

Referring to FIG. 6, the lead screw 135 may include a shaft body 135a and a screw 135b. The shaft body 135a may be in the shape of an elongated cylinder, and the screw 135b may be formed on an outer circumferential surface of the shaft body 135a. The moving block 134 may include a moving body 134a and a sliding block 134b. For example, the moving body 134a may be made of metal, and the sliding block 134b may be made of a synthetic resin. The sliding block 134b may be disposed inside the moving body 134a. The sliding block 134b may be screw-coupled to the lead screw 135.

The lead screw 135 may be inserted into the sliding block 134b. The sliding block 134b may move on the lead screw 135 by the rotation of the lead screw 135. Clearance may be formed between an inner circumferential surface of the sliding block 134b and the screw 135b of the lead screw 135, thereby preventing the moving block 134 from being caught or locked while moving on the lead screw 135.

Figure 7:
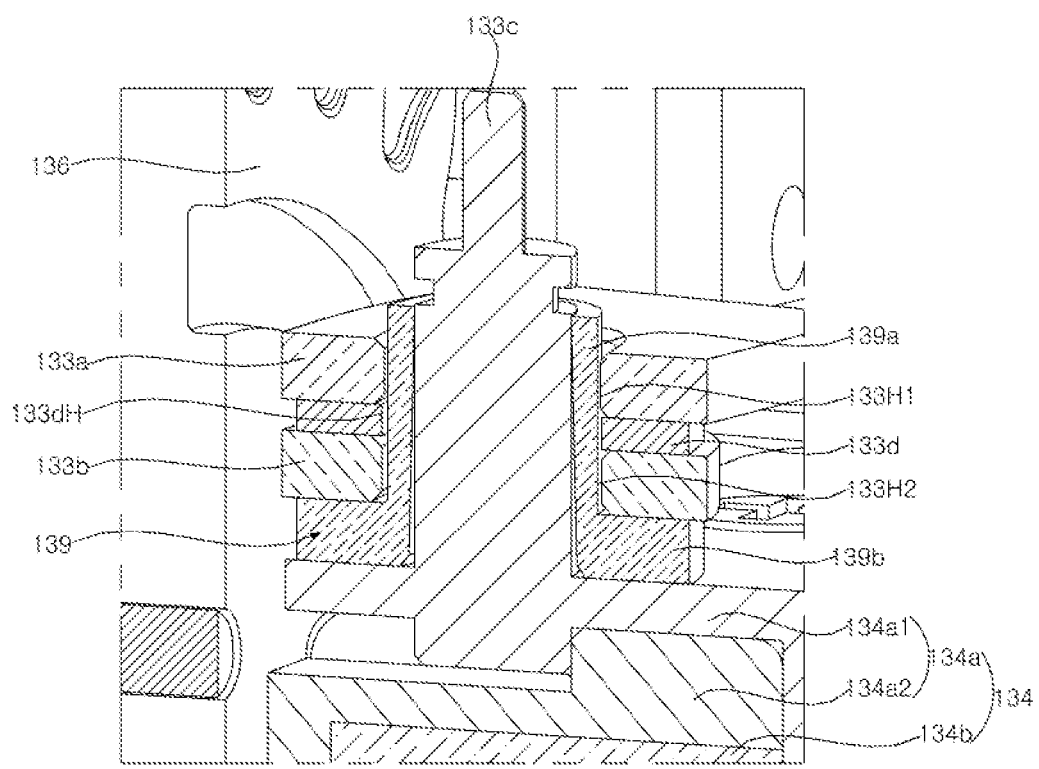

Referring to FIG. 7, the moving body 134a may include an outer part 134a1 and an inner part 134a2. The outer part 134a1 may form an outer surface of the moving body 134a. The inner part 134a2 may be coupled to the inside of the outer part 134a1. For example, the outer part 134a1 may be a U-shaped metal plate, and the inner part 134a2 may be a metal shell having an inner receiving space. The sliding block 134b may be coupled to the inside of the inner part 134a2.

A pivot pin 133c may protrude and extend from the outer part 134a1 of the moving body 134a. The first frame 133a and the second frame 133b of the flip frame 133 may include holes 133H1 and 133H2. The pivot pin 133c may be inserted into the hole 133H2 of the second frame 133b and the hole 133H1 of the first frame 133a. A disc 133d may be disposed between the first frame 133a and the second frame 133b, and the pivot pin 133c may be inserted into a hole 133dH of the disk 133d. For example, the disk 133d may be made of a material having high durability and low friction characteristics.

An intermediate member 139 may be disposed between the moving body 134a, the pivot pin 133c, and the flip frame 133. The intermediate member 139 may cover an upper surface of the moving body 134a and an outer surface of the pivot pin 133c. The intermediate member 139 may be referred to as a low friction member 139 or a lubricating member 139. In addition, the intermediate member 139 may be referred to as a skin member 139.

The intermediate member 139 may include a body part 139a and a flange part 139b. The body part 139a may have a cylindrical shape. The pivot pin 133c may be inserted into the body part 139a. The body part 139a may make contact with the outer surface of the pivot pin 133c, and the flange part 139b may make contact with the upper surface of the moving body 134a. The intermediate member 139 may be made of a synthetic resin having low friction characteristics. The intermediate member 139 may be made of a low friction material. For example, the intermediate member 139 may be made of polyoxymethylene (POM, acetal homopolymer). The first frame 133a and the second frame 133b of the flip frame 133 may move about the pivot pin 133c while making contact with or rubbing against the intermediate member 139.

The intermediate member 139 may fill a gap between the pivot pin 133c and the hole 133H1 of the first frame 133a of the flip frame 133. The intermediate member 139 may fill a gap between the pivot pin 133c and the hole 133H2 of the second frame 133b of the flip frame 133. The second frame 133b of the flip frame 133 may be placed on the intermediate member 139. Accordingly, the pivot pin 133c may transmit force to the flip frame 133 without causing noise or vibrations.

Figure 8:
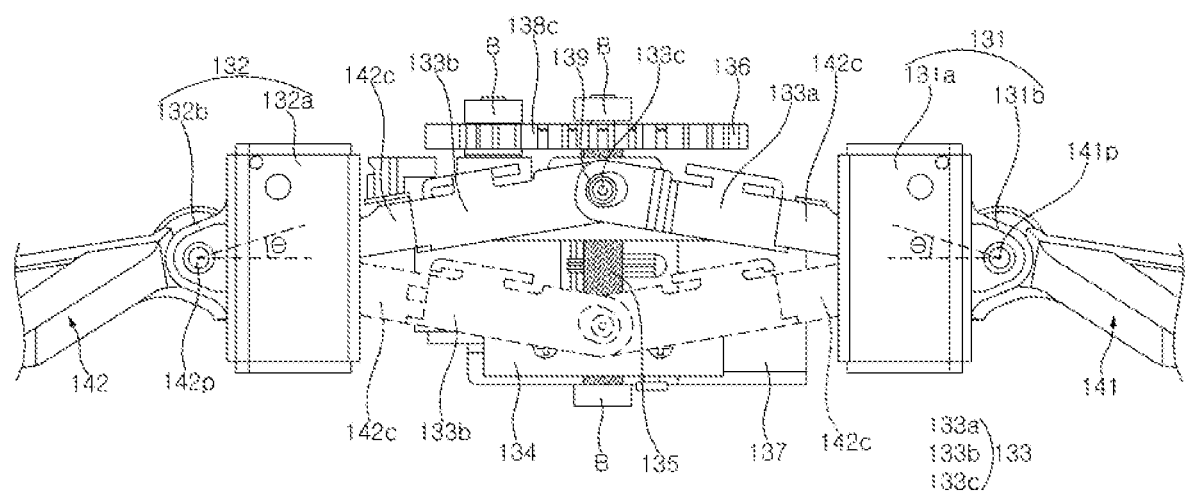
Figure 9:
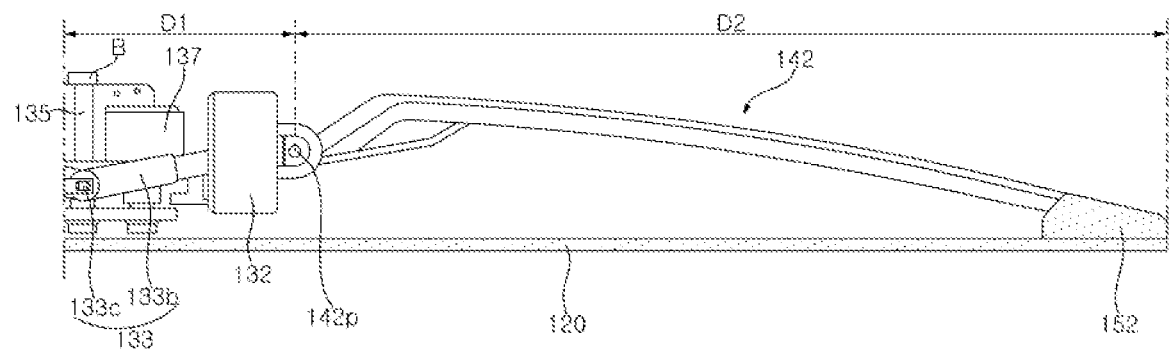

Referring to FIGS. 8 and 9, when the lead screw 135 rotates, the moving block 134 and the flip frame 133 may move on the lead screw 135. The flip frame 133 may perform a reciprocating motion in a longitudinal direction of the lead screw 135. The movement of the flip frame 133 allows the first wing 141 and/or the second wing 142 to pivot about the pivot shafts 141P and 142P.

A first distance D1 from the pivot pin 133c to the pivot shafts 141P and 142P may be smaller than a second distance D2 from the pivot shafts 141P and 142P to the sliding mounts 151 and 152. For example, the first distance D1 may be one-fourth of the second distance D2. The levers 141c and 142c of the wings 141 and 142 are fixed to the flip frame 133, and when the pivot pin 133c moves, the flip frame 133 moves together with the pivot pin 133c, such that a driving force of the moving block 134, moving on the lead screw 135, may be transmitted efficiently to the levers 141c and 142c of the wings 141 and 142 via the flip frame 133.

In addition, as the levers 141c and 142c of the wings 141 and 142 are fixed to the flip frame 133 and move together with the flip frame 133, the first distance D1 increases such that less force is required to drive the wings 141 and 142, thereby increasing power transmission efficiency of the driving unit 130 and reducing power consumption of the motor 137.

Figure 10:
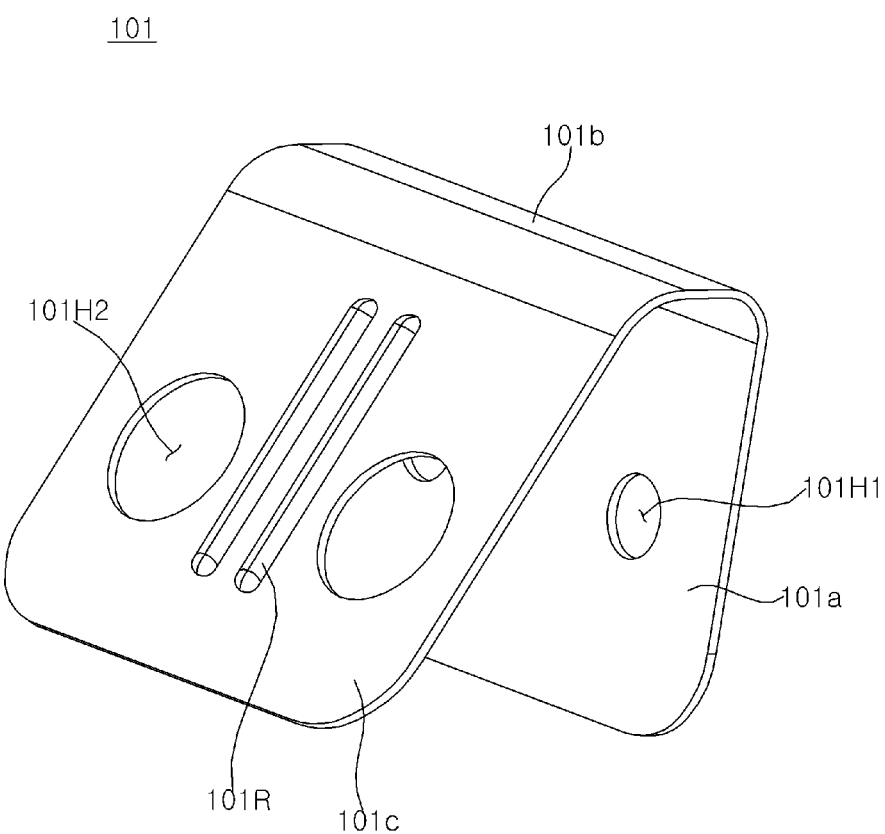
Figure 11:
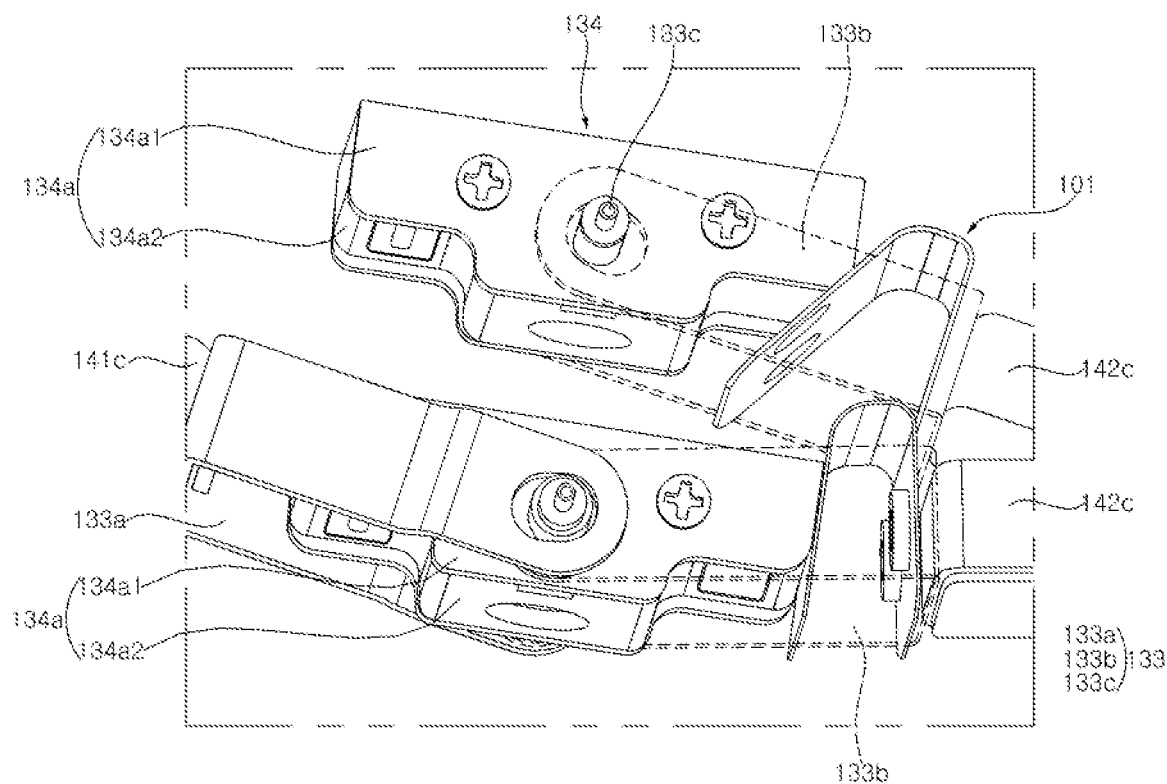

Referring to FIGS. 10 and 11, an elastic member 101 may include a first part 101a, a second part 101b, and a third part 101c. The elastic member 101 may be referred to as a first elastic member 101 or a clip 101. The first part 101a may be a plate. The second part 101b may be bent and extend from the first part 101a. The third part 101c may be bent and extend from the second part 101b. The third part 101c may face the first part 101a. A second angle formed between the second part 101b and the third part 101c may be greater than a first angle formed between the first part 101a and the second part 101b. In the extending direction, the third part 101c may be longer than the first part 101a. The elastic member 101 may be a metal plate and may have elasticity. For example, the elastic member 101 may be a leaf spring.

A coupling hole 101H1 may be formed in the first part 101a. There may be a plurality of coupling holes 101H1. A support rib 101R may be formed on the third part 101c. The support rib 101R may be elongated in the direction in which the third part 101c extends. There may be a plurality of support ribs 101R. The support ribs 101R may protrude from an outer surface of the third part 101c. The plurality of support ribs 101R may be parallel to each other.

The elastic member 101 may be inserted between the moving block 134 and the levers 141c and 142c of the wings 141 and 142. The first part 101a of the elastic member 101 may be fixed to the levers 141c and 142c of the wings 141 and 142. For example, the first part 101a of the elastic member 101 may be screw-coupled to the levers 141c and 142c of the wings 141 and 142. The third part 101c of the elastic member 101 may support the moving block 134. The third part 101c of the elastic member 101 may make contact with a side surface of the moving block 134. The third part 101c of the elastic member 101 may make contact with the outer part 134a1 and/or the inner part 134a2 of the moving body 134a. The outer part 134a1 and/or the inner part 134a2 of the moving body 134a, making contact with the third part 101c of the elastic member 101, may be rounded. The support ribs 101R formed on the third part 101c of the elastic member 101 may make contact with the inner part 134a2 of the moving block 134.

There may be a plurality of elastic members 101. Each of the plurality of elastic members 101 may be inserted between the moving block 134 and the lever 141c of the first wing 141 and between the moving block 134 and the lever 142c of the second wing 142.

In a mechanism in which the flip frame 133 flips or pivots about the pivot pin 133c, clearance may be formed between the pivot pin 133c of the moving block 134 and the holes 133H1 and 133H2 (see FIG. 7) of the flip frame 133. The elastic member 101 may push the moving block 134 in one direction. As the elastic member 101 pushes the moving block 134 in one direction, the pivot pin 133c of the moving block 134 may be pressed against one side of the holes 133H1 and 133H2 of the flip frame 133.

Accordingly, in the entire region in which the moving block 134 moves on the lead screw 134, the moving block 134 may transmit force to the flip frame 133. In a mechanism in which the moving block 134 transmits force to the flip frame 133, clearance between the components may cause the display panel 110 to temporarily stop bending. In this embodiment of the present disclosure, continuous bending of the display panel 110 may be performed.

Figure 12:
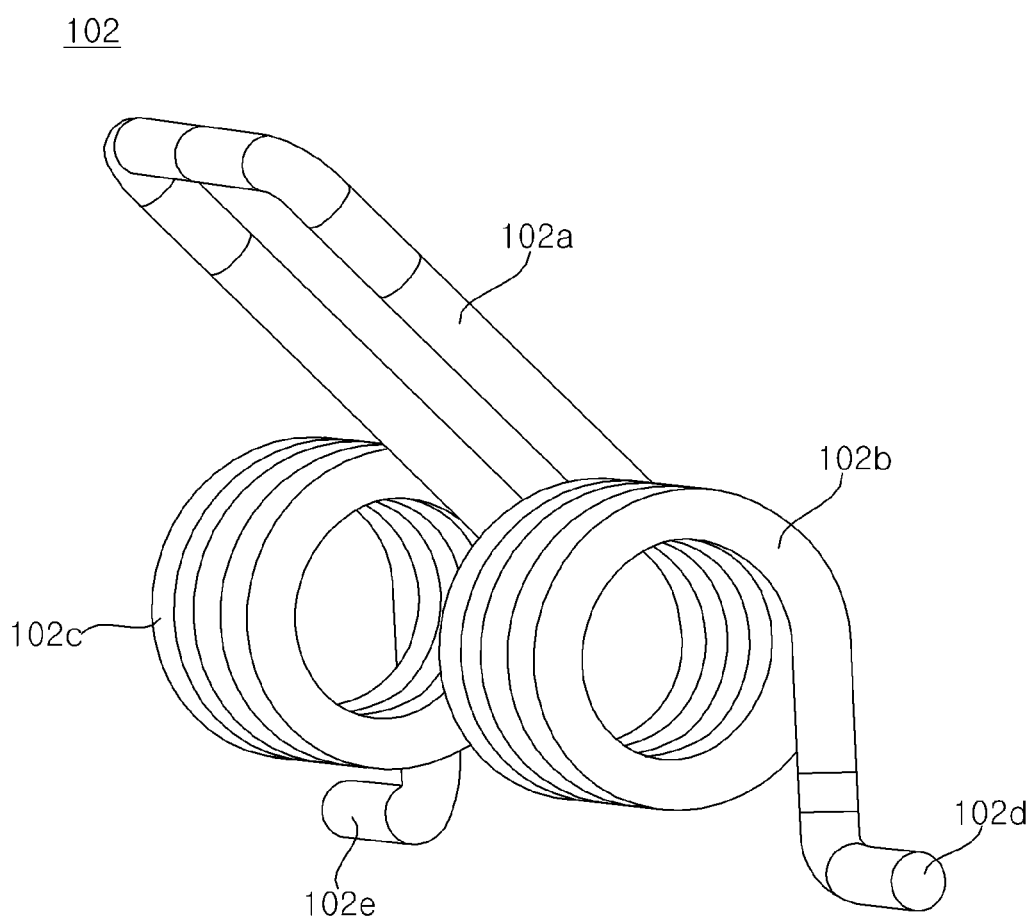
Figure 13:
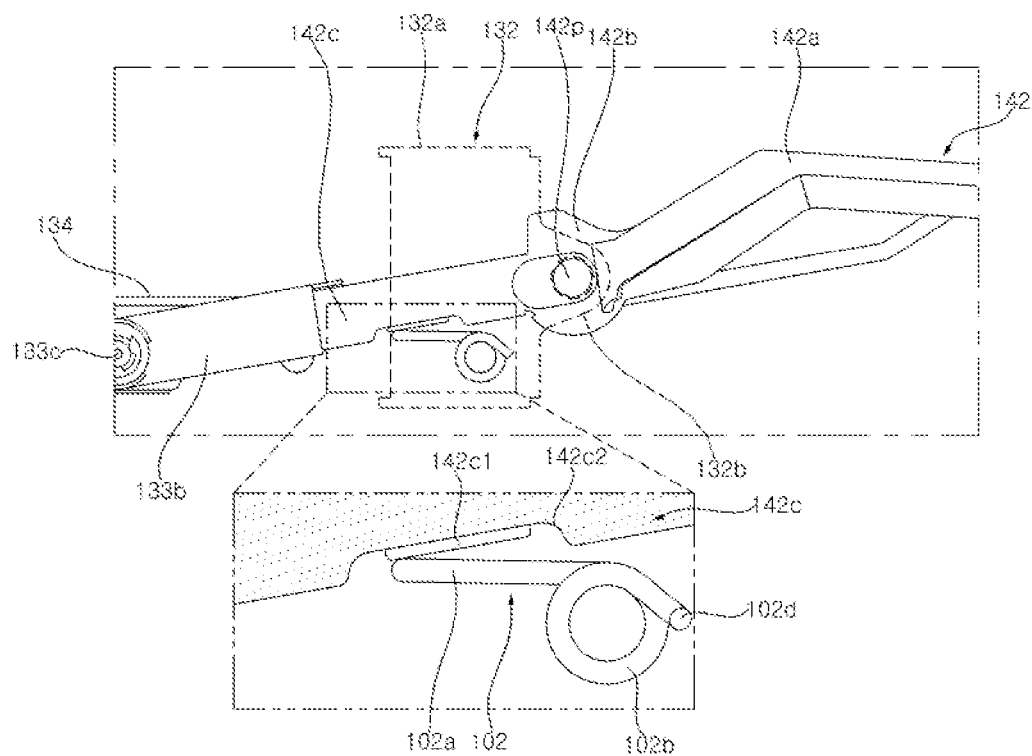

Referring to FIGS. 12 and 13, an elastic member 102 may include a lever part 120a, support parts 102d and 102e, and coil parts 102b and 102c. The elastic member 102 may be formed as a wire. The elastic member 102 may be referred to as a second elastic member 102.

The lever part 102a may be a wire bent in a U-shape. The coil parts 102b and 102c may be connected to the lever part 102a. There may be a plurality of coil parts 102b and 102c. A first coil part 102b may be connected to a first end of the lever part 102a, and the second coil part 102c may be connected to a second end of the lever part 102a. There may be a plurality of support parts 102d and 102e. A first support part 102d may form a distal end of the first coil part 102b, and the second support part 102e may form a distal end of the second coil part 102c.

When the support parts 102d and 102e are fixed, the lever part 102a may rotate or pivot about the coil parts 102b and 102c. The coil parts 102b and 102c may provide elasticity to the lever part 102a.

The elastic member 102 may be disposed on the wing bracket 132. The support parts 102d and 102e of the elastic member 102 may be fixed to the bracket frame 132a of the wing bracket 132. The lever part 102a of the elastic member 102 may be supported by the lever 142c of the wing 142.

The wing 142 may include a support groove 142c2 and a friction pad 142c1. The support groove 142c2 may be formed at a position corresponding to a portion of a length of the lever part 102a of the elastic member 102. The friction pad 142c1 may be formed on the support groove 142c2. The friction pad 142c1 may protrude from the support groove 142c2 and a surface of the friction pad 142c1 may be smoothly polished.

When the wings 141 and 142 are pivotally coupled to the wing brackets 131 and 132, clearance may be formed between the pivot shafts 141p and 142p of the wings 141 and 142 and the wing holders 131b and 132b of the wing brackets 131 and 132. In a mechanism in which the moving block 134 transmits force to the flip frame 133 to allow the wings 141 and 142 to bend the display panel 110, the clearance between the components may cause the display panel 110 to temporarily stop bending. The wings 141 and 142 may receive force from the elastic member 102 in a forward direction of the display device 100, thereby allowing for continuous bending of the display panel 110. In addition, power consumption of the motor 137 required to bend the display panel 110 may be reduced.

In addition, as the sliding block 134b (see FIG. 6) is screw-coupled to the lead screw 135, clearance may be formed to allow the sliding block 134b to move on the lead screw 135. As the elastic member 102 pushes the wings 141 and 142 to press the sliding block 134b in one direction of the lead screw 135, continuous bending of the display panel 110 may be performed. Further, when the torque of the motor 137 and the lead screw 135 is released while the display panel 110 is in a flat shape, flatness of the display panel 110 may be changed. In this embodiment, the display panel 110 may remain flat and/or curved with a predetermined curvature.

Figure 14:
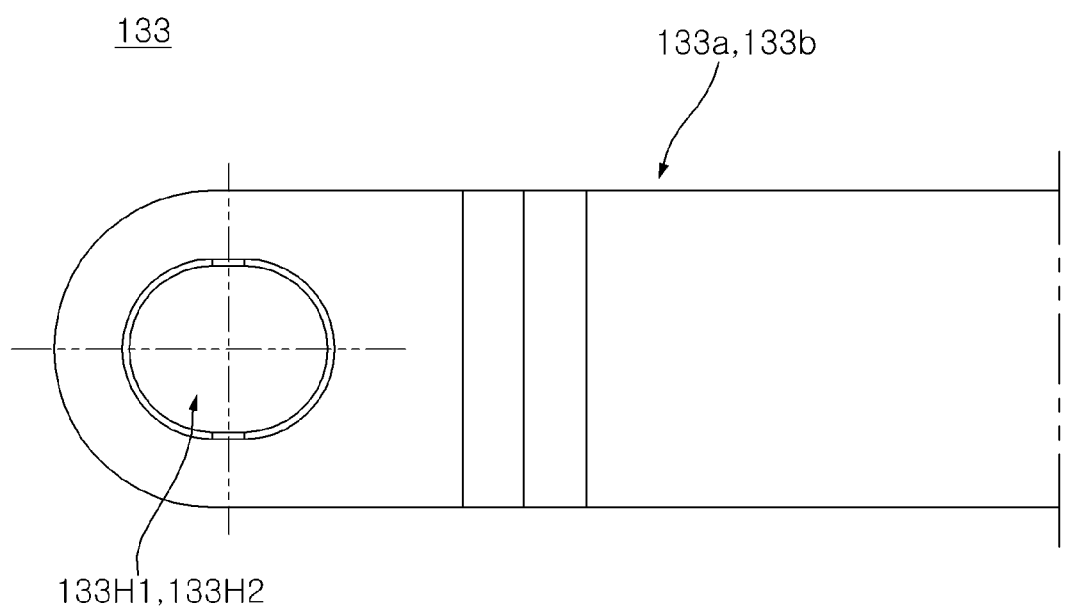

Referring to FIGS. 14, the flip frame 133 may have the holes 133H1 and 133H2. The holes 133H1 and 133H2 may be formed adjacent to a distal end of the first frame 133a and/or the second frame 133b of the flip frame 133. The holes 133H1 and 133H2 may be long holes 133H1 and 133H2 having a major axis and a minor axis. The major axis of the holes 133H1 and 133H2 may be parallel to a longitudinal direction of the frame 133. The minor axis of the holes 133H1 and 133H2 may cross the longitudinal direction of the frame 133.

Figure 15:
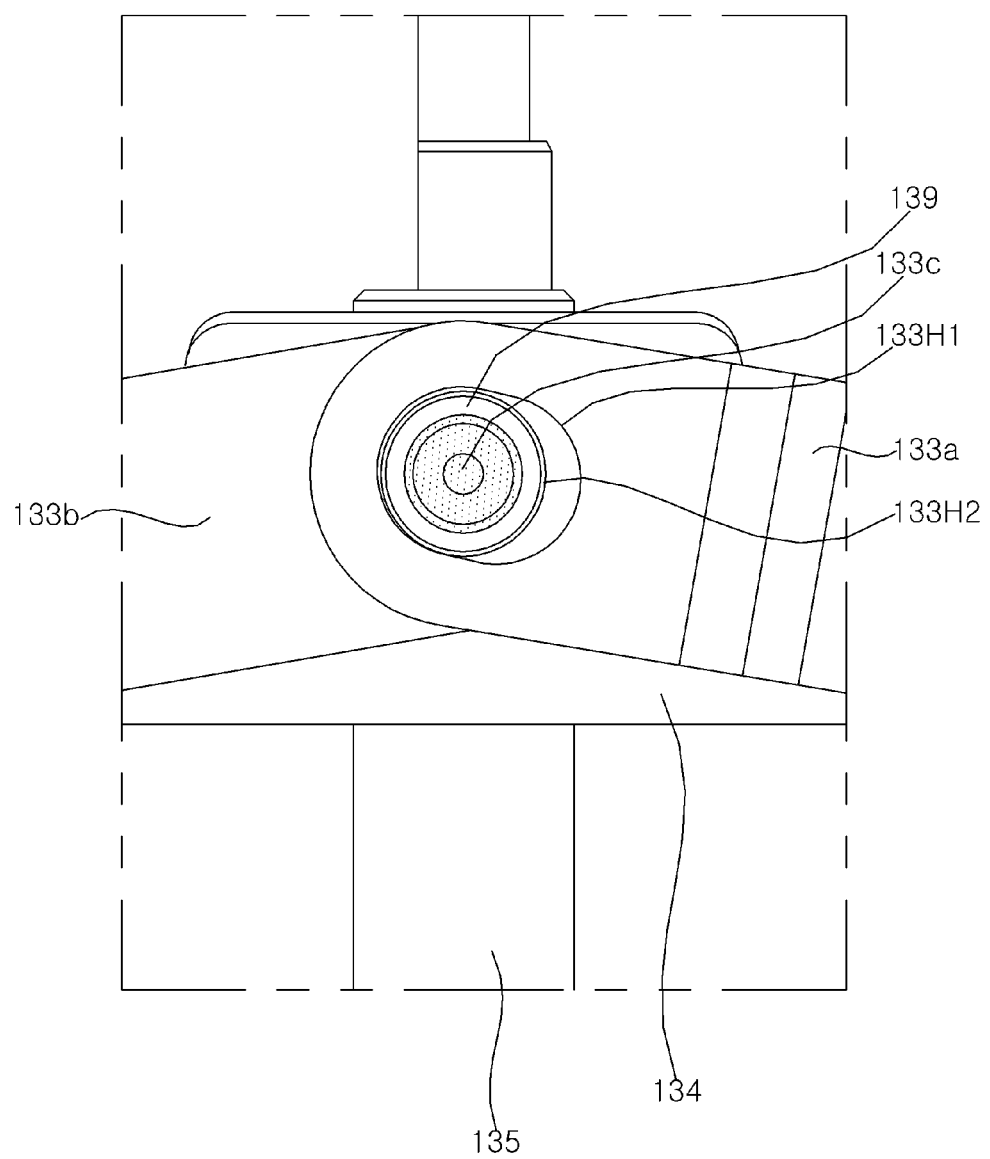
Figure 16:
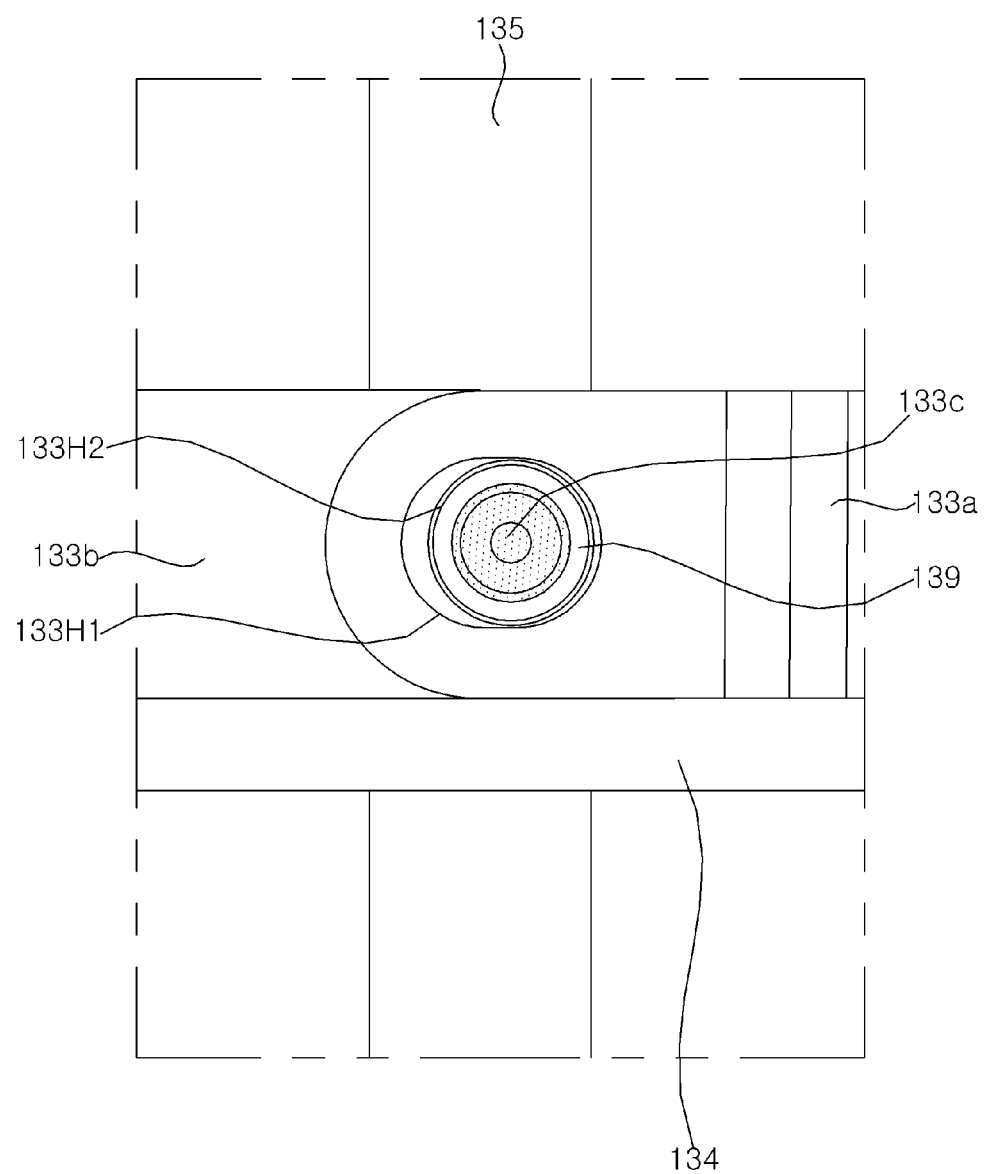
Figure 17:
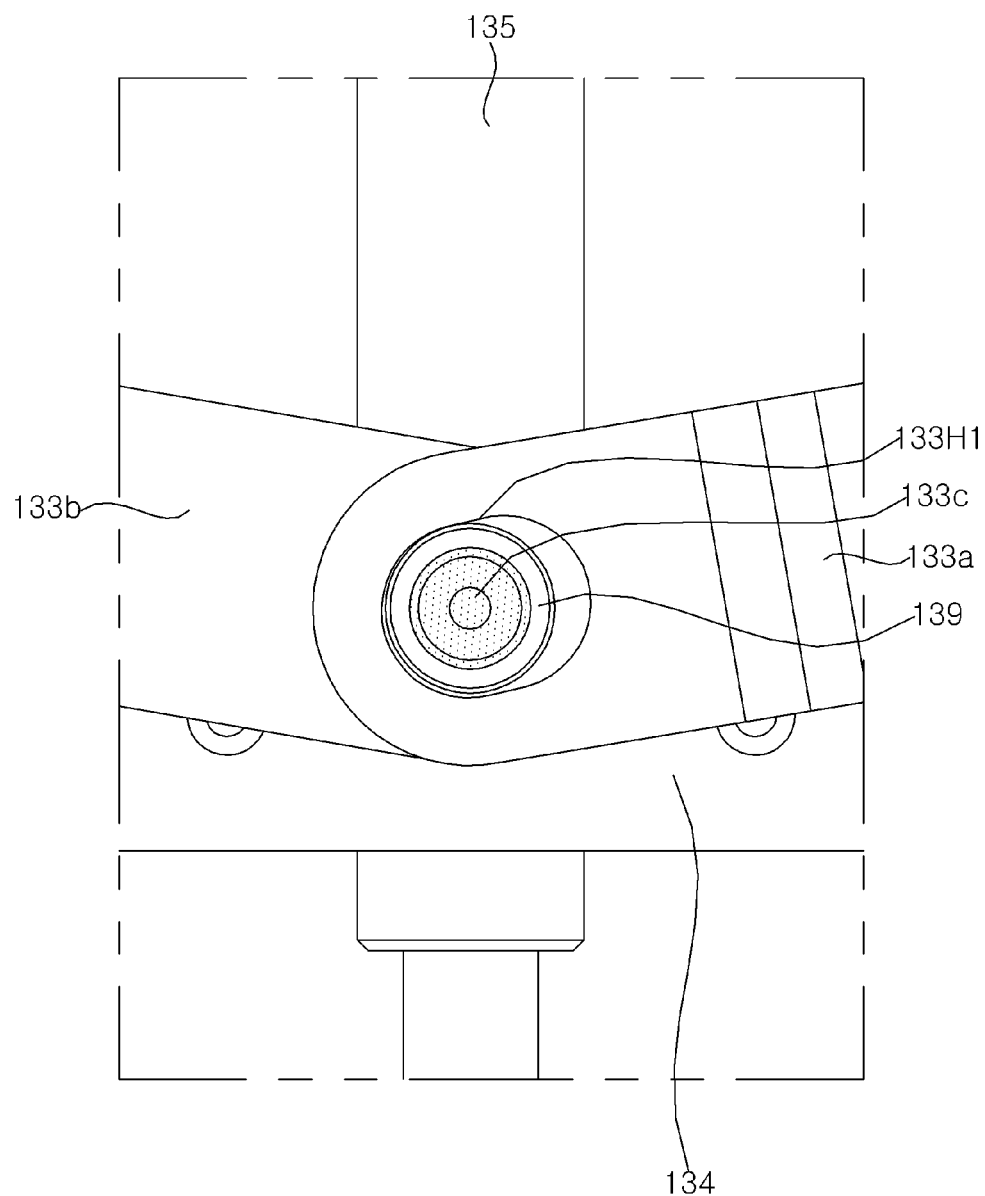

Referring to FIGS. 15 to 17, the pivot pin 133c may be inserted into the holes 133H1 and 133H2 of the flip frame 133, and the moving block 134 may move on the lead screw 135. As the moving block 134 moves on the lead screw 135, the display panel 110 changes from a flat screen (see FIG. 15) to a curved screen (see FIG. 16), in which the display panel 110 may be curved with a constant curvature (see FIG. 17).

When the display panel 110 starts to become curved after being in a flat shape, or when the display panel 110, after being curved with a predetermined curvature, becomes flat as a radius of curvature becomes greater than a predetermined radius of curvature, a moving direction of the moving block 134 may be changed. That is, at a start point and an end point of the moving block 134, the display panel 110 may be flat or may be curved with a predetermined curvature.

When the moving direction of the moving block 134 is changed at the start point and/or the end point, a direction in which the pivot pin 133c applies force to the holes 133H1 and 133H2 of the flip frame 133 may be changed. As the direction in which the pivot pin 133c applies force to the holes 133H1 and 133H2 of the flip frame 133 is changed, clearance formed between the pivot pin 133c and the holes 133H1 and 133H2 of the flip frame 133 may stop the continuity of change in curvature of the display panel 110.

Figure 18:
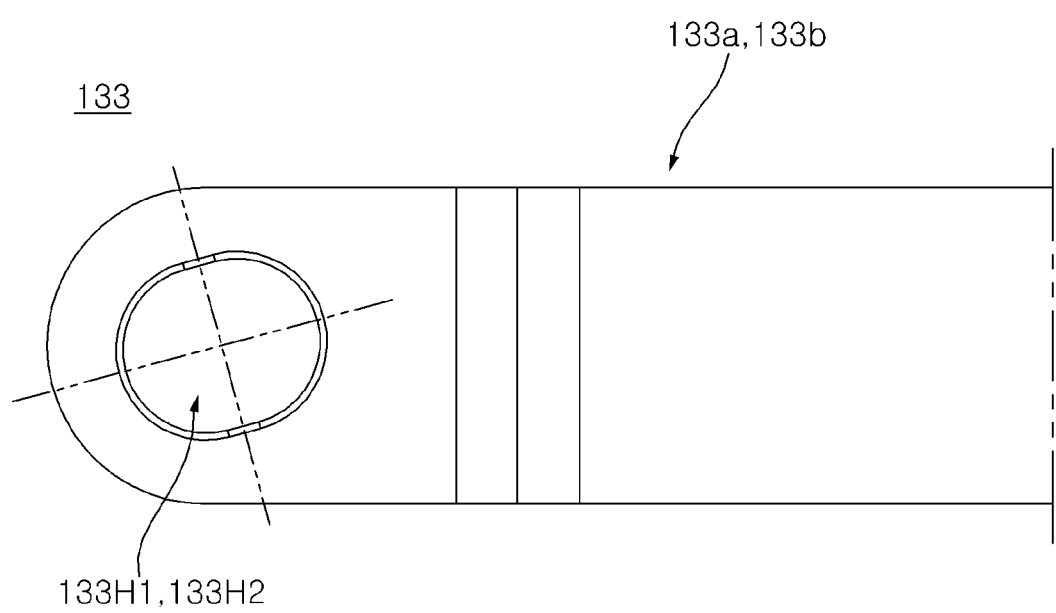
Figure 19:
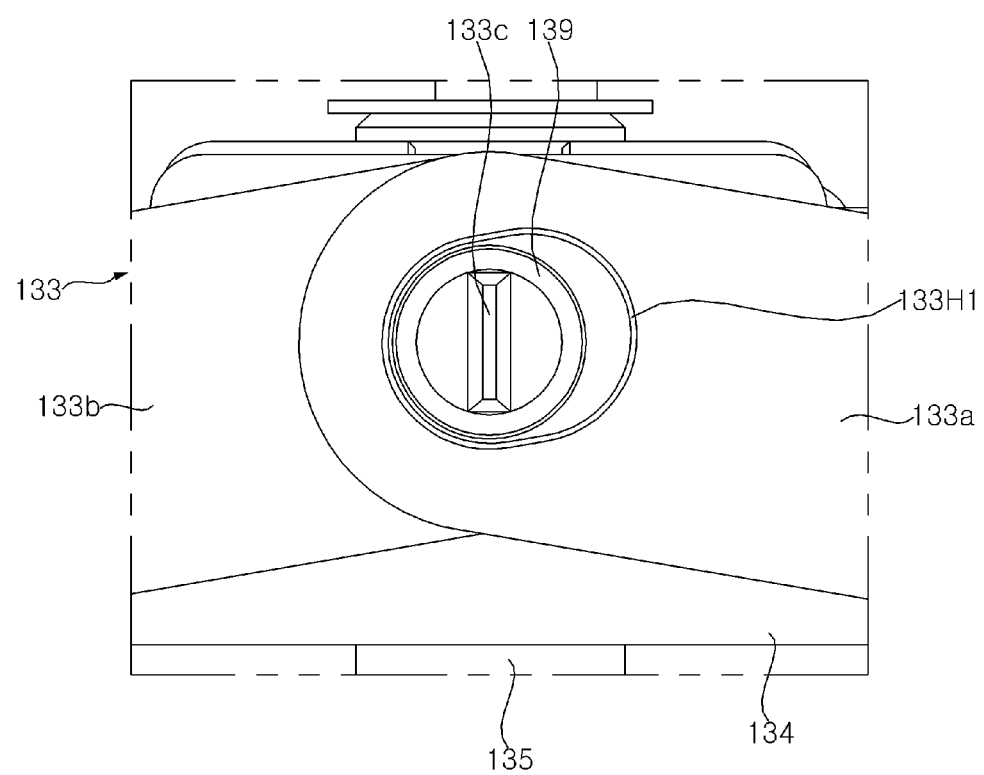

Referring to FIGS. 18 and 19, the major axis of the holes 133H1 and 133H2 of the flip frame 133 may form an angle θ with respect to a longitudinal direction of the flip frame 133. For example, the angle θ may correspond to an angle θ formed between the pivot shafts 141p and 142p of the wings 141 and 142 (see FIG. 8) and the start point or the end point of the moving block 134 with respect to a line connecting the pivot shafts 141p and 142p of the wings 141 and 142.

As the holes 133H1 and 133H2 of the flip frame 133 move closer to the start point or the end point of the moving block 134, the major axis of the holes 133H1 and 133H2 of the flip frame 133 may become parallel to a baseline connecting the pivot shafts 141p and 142p of the wings 141 and 142 of the moving block 134. When a moving direction of the pivot pin 133c is changed, the moving direction of the pivot pin 133c may be aligned with a direction of the minor axis of the holes 133H1 and 133H2 of the flip frame 133.

When the moving direction of the pivot pin 133c is changed such that the moving direction of the pivot pin 133c is aligned with the minor axis of the holes 133H1 and 133H2 of the flip frame 133, clearance formed between the pivot pin 133c and the holes 133H1 and 133H2 of the flip frame 133 may be minimized. Accordingly, by the movement and/or direction change of the moving block 134, the pivot pin 133c may continuously transmit power or force to the flip frame 133.

Figure 20:
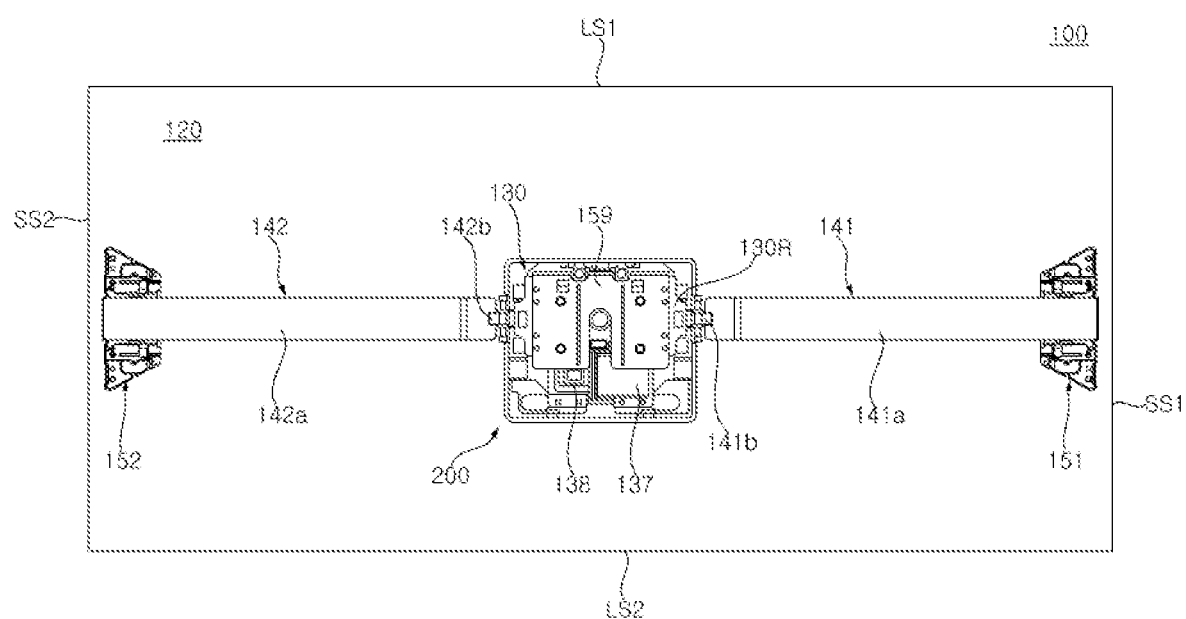
Figure 21:
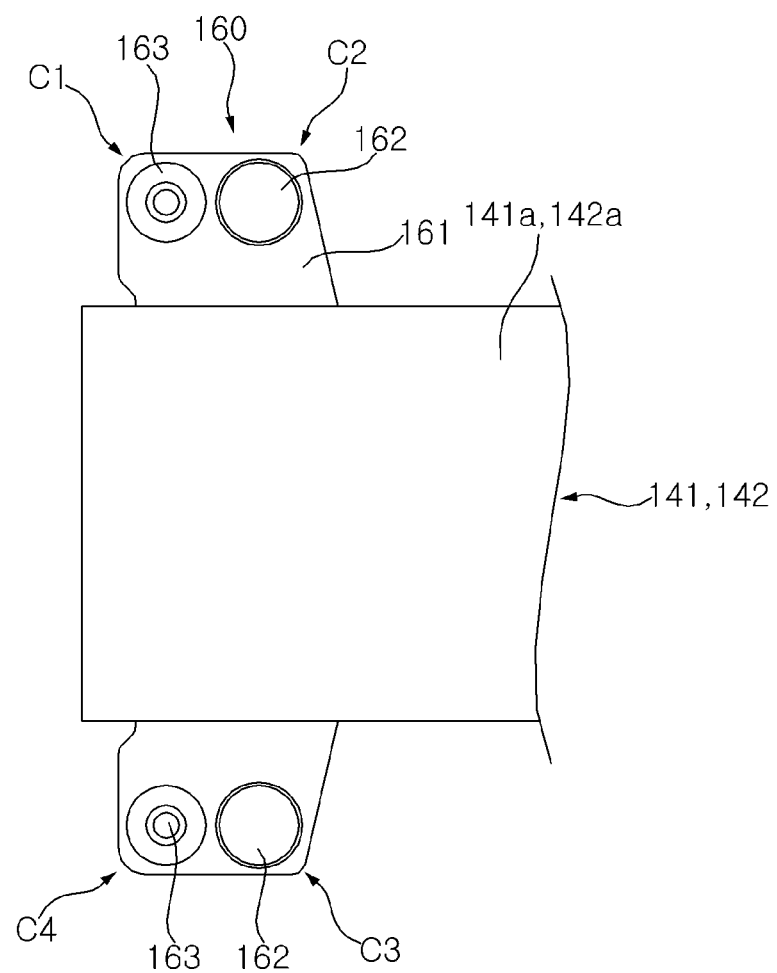

Referring to FIGS. 20 and 21, a first sliding mount 151 may be fixed to the rear surface of the plate 120 at a position adjacent to the first short side SS1 of the plate 120. The second sliding mount 152 may be fixed to the rear surface of the plate 120 at a position adjacent to the second short side SS2 of the plate 120.

The driving module 130 may be disposed between the first sliding mount 151 and the second sliding mount 152 and may be coupled to the rear surface of the plate 120. The first wing 141 may have a first end pivotally connected to the driving module 130 and a second end coupled to the first sliding mount 151. The second end of the first wing 151 may move on the first sliding mount 151. The second wing 142 may have a first end pivotally connected to the driving module 130 and a second end coupled to the second sliding mount 152. The second end of the second wing 142 may move on the second sliding mount 152.

A PCB plate 159 may be disposed at the rear of the driving module 130. The PCB plate 159 may be fixed to the rear bracket 130R (see FIG. 2) of the driving module 130. Printed Circuit Boards (PCBs) may be coupled to the PCB plate 159.

A side cover 200 may form a wall around the sides of the driving module 130. For example, the side cover 200 may be a square frame. A back cover (not shown) may be coupled to the side cover 200 while covering the driving module 130.

A slide bracket 160 may be coupled or fixed to distal ends of the wings 141 and 142. The slide bracket 160 may include a body 161 having an elongated plate shape and protrusions 162 and 163 formed adjacent to both ends of the body 161. The protrusions 162 and 163 may be referred to as friction protrusions 162 and 163 or contact protrusions 162 and 163. For example, the slide bracket 160 may be made of metal.

There may be a plurality of protrusions 162 and 163. The plurality of protrusions 162 and 163 may include front protrusions 163 and rear protrusions 162. The front protrusions 163 may be formed at the first corner C1 and/or the fourth corner C4 of the body 161. The front protrusions 163 may protrude by being pressed toward the front of the body 161. The front protrusions 163 may have a dome shape or a hemispherical shape. The rear protrusions 162 may be formed at the second corner C2 and/or the third corner C3 of the body 161. The rear protrusions 162 may protrude by being pressed toward the rear of the body 161. The rear protrusions 162 may have a dome shape or a hemispherical shape. The rear protrusions 162 may be adjacent to the front protrusions 163. The front protrusions 163 and the rear protrusions 162 may be disposed sequentially along the short side of the body 161. One first pair of the front protrusion 163 and the rear protrusion 162 may be disposed opposite another pair of the front protrusion 163 and the rear protrusion 162 with respect to the wings 141 and 142.

Figure 22:
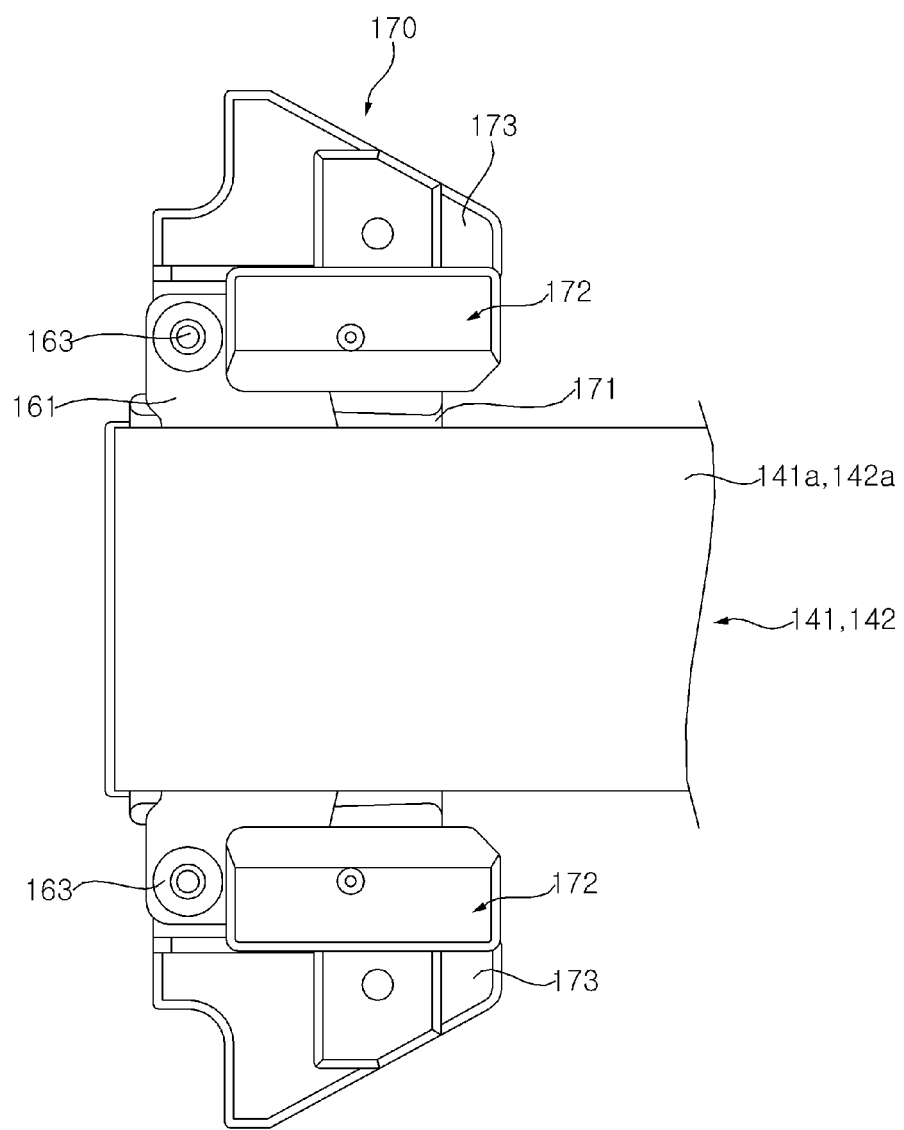
Figure 23:
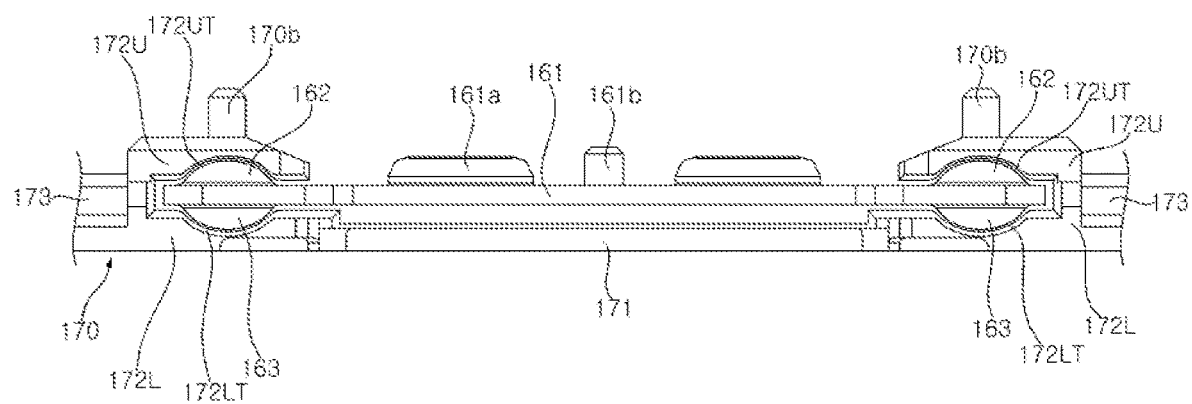

Referring to FIGS. 22 and 23, the slide bracket 160 may be coupled to the guide cover 170. The slide bracket 160 may be inserted into the guide cover 170 and may move on the guide cover 170. For example, the guide cover 170 may be made of a synthetic resin having low frictional force. The guide cover 170 may be made of a low friction material. For example, the guide cover 170 may be made of polyoxymethylene (POM, acetal homopolymer).

The guide cover 170 may include a base 171, a side rail 172, and a fixing plate 173. The base 171 may have an elongated plate shape and may face the slide bracket 160. The side rail 172 may be formed at both ends of the base 171. The side rail 172 may include a lower part 172L and an upper part 172U. The lower part 172L may extend from the base 171.

A lower trench 172LT may be formed in the lower part 172L. The lower trench 172LT may be formed in the lower part 172L as an upper surface of the lower part 172L is recessed inward in an elongated shape. For example, the lower trench 172LT may be in the shape of a half pipe. The front protrusion 163 of the slide bracket 160 may move on the lower trench 172LT. A radius of curvature of the front protrusion 163 may be smaller than a radius of curvature of the lower trench 172LT. Accordingly, the front protrusion 163 may make point contact with the lower trench 172LT.

The upper part 172U may be spaced apart from the lower part 172LT and may face the lower part 172L. A gap may be formed between the upper part 172U and the lower part 172L, and the slide bracket 160 may be inserted into the gap. An upper trench 172UT may be formed in the upper part 172U. The upper trench 172UT may be formed in the upper part 172UT as a lower surface of the upper part 172U is recessed inward in an elongated shape. For example, the upper trench 172UT may be in the shape of a half pipe. The rear protrusion 162 of the slide bracket 160 may move on the lower trench 172LT. A radius of curvature of the rear protrusion 162 may be smaller than a radius of curvature of the upper trench 172UT. Accordingly, the rear protrusion 162 may make point contact with the upper trench 172UT.

As the slide bracket 160 and the guide cover 170 are coupled to each other, it is possible to prevent drooping or sagging of the wings 141 and 142 due to self-weight.

The slide bracket 160 may include a coupling part 161a and a PEM nut 161b or a coupling protrusion 161b for coupling with the wings 141 and 142. The guide cover 170 may include a PEM nut 170b or a coupling protrusion 170b for coupling with the sliding mounts 151 and 152.

Figure 24:
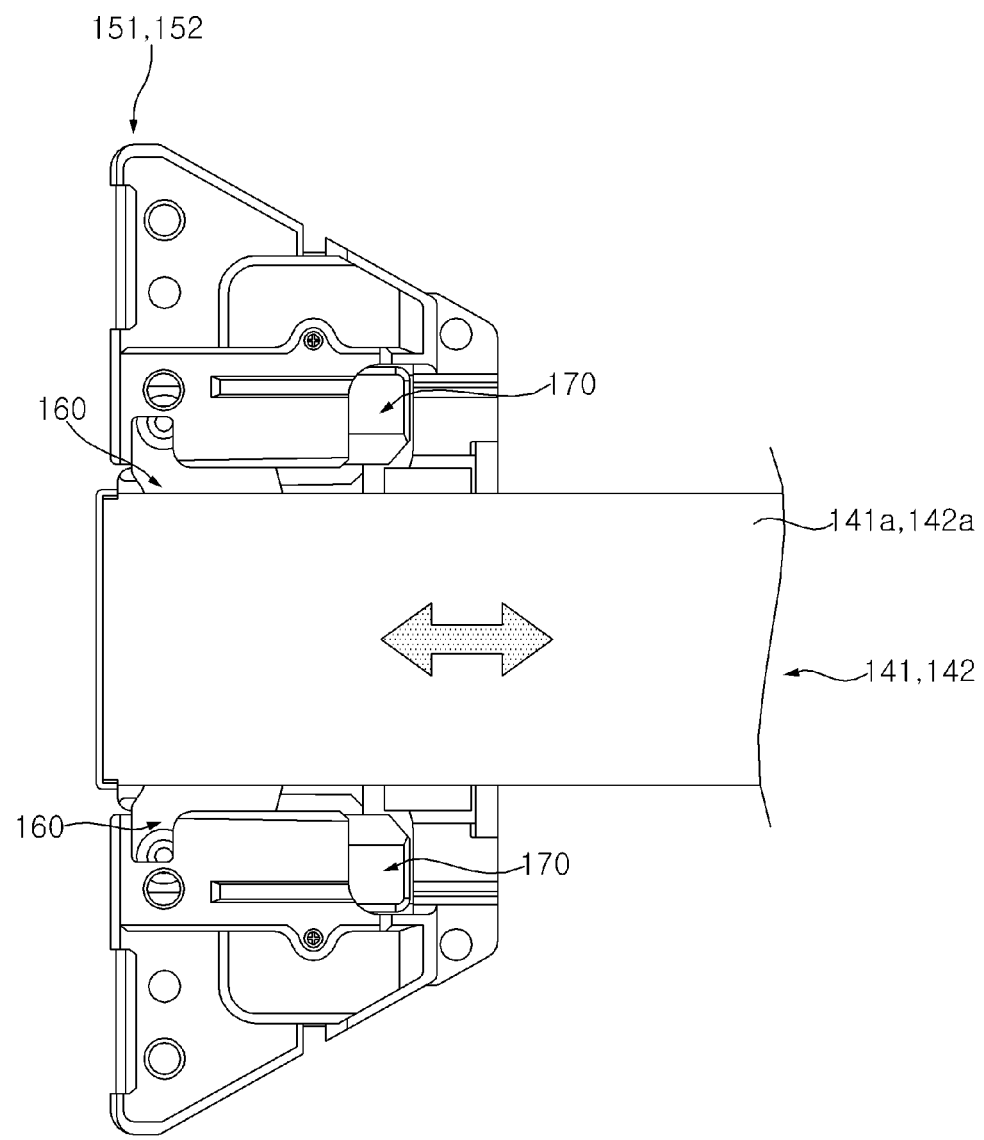
Figure 25:
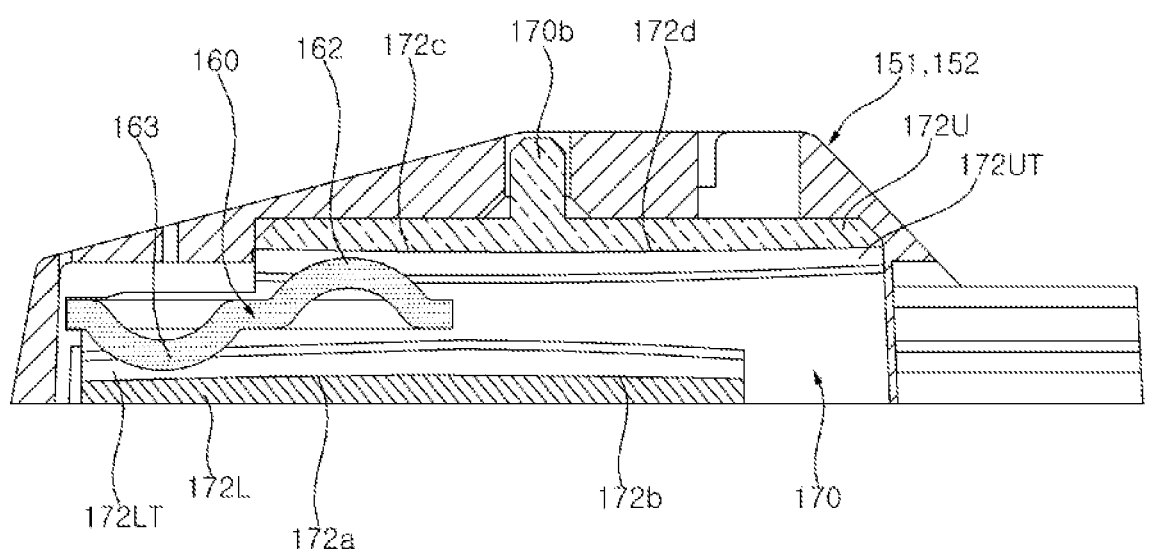
Figure 26:
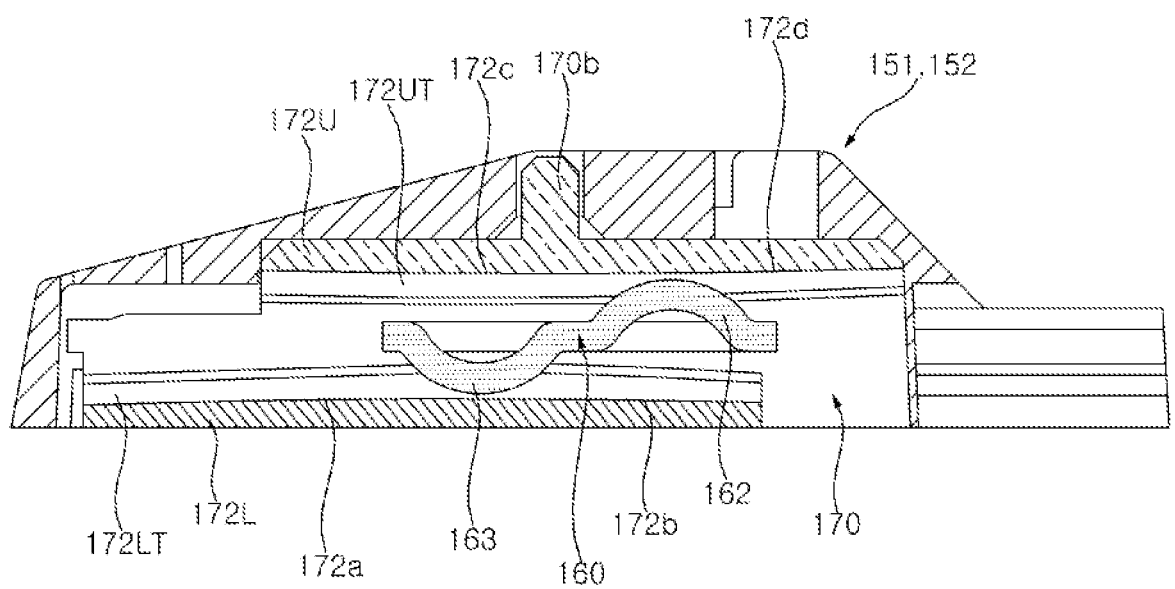

Referring to FIGS. 24 to 26, the slide bracket 160 may be coupled to front surfaces of the wing blades 141a and 142b at a position adjacent to the distal ends of the wings 141 and 142. The guide cover 170 may be fixed to the sliding mounts 151 and 152. The slide bracket 160 may be inserted into the guide cover 170 and may move on the guide cover 170 while performing a reciprocating motion in a longitudinal direction of the wings 141 and 142.

When the display panel 110 becomes flat after being curved with a predetermined curvature, the slide bracket 160 may move on the guide cover 170 toward the short sides SS1 and SS2 of the plate 120. The front protrusion 163 may move on the lower trench 172LT. The front protrusion 163 may move on the lower trench 172LT while making contact with or rubbing smoothly against a surface of the lower trench 172LT. The rear protrusion 162 may move on the upper trench 172UT while making contact with or rubbing smoothly against a surface of the upper trench 172UT.

When the display panel 110 changes from flat to curved with a predetermined curvature, the slide bracket 160 may move on the guide cover 170 from the short sides SS1 and SS2 of the plate 120 toward the driving module 130. The front protrusion 163 may move on the lower trench 172LT. The front protrusion 163 may move on the lower trench 172LT while making contact with or rubbing smoothly against the surface of the lower trench 172LT. The rear protrusion 162 may move on the upper trench 172UT while making contact with or rubbing smoothly against the surface of the upper trench 172UT.

As the protrusions 162 and 163 make point contact with the trenches 172LT and 172UT, it is possible to reduce friction and abrasion caused by the friction, and no lubricant is required, thereby improving structural durability of a mechanism.

Figure 27:
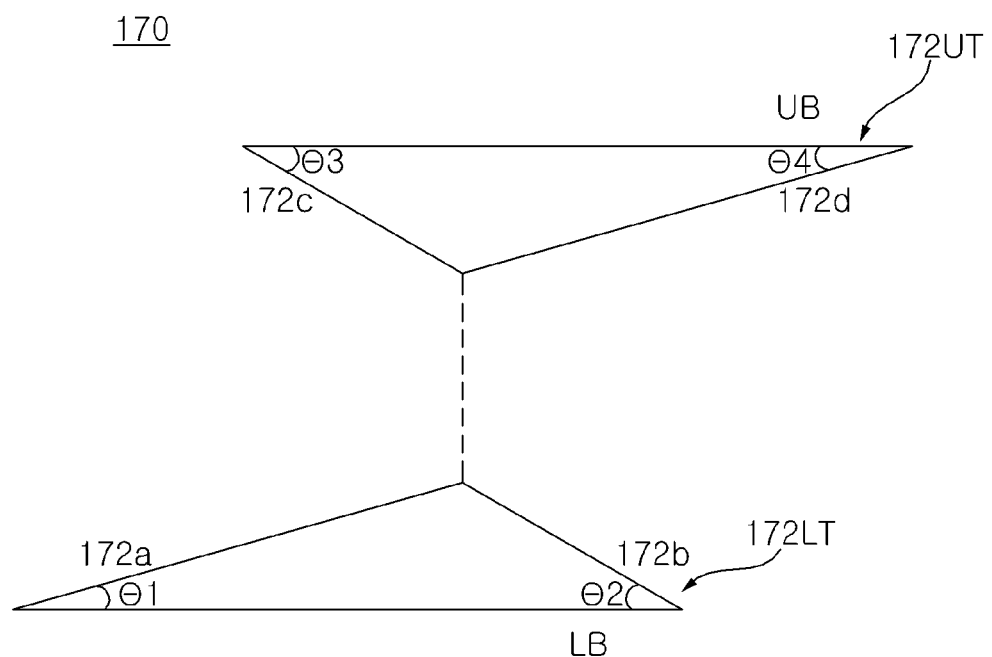

Referring to FIG. 27, the lower trench 172LT may include a first inclined surface 172a and a second inclined surface 172b, and the upper trench 172UT may include a third inclined surface 172c and a fourth inclined surface 172d. The first inclined surface 172a may form a first angle θ1 with respect to a base surface LB. The second inclined surface 172b may form a second angle θ2 with respect to the base surface LB. The second inclined surface 172b may make contact with the first inclined surface 172a.

The third inclined surface 172c may form a third angle θ3 with respect to the base surface UB. The fourth inclined surface 172d may form a fourth angle θ4 with respect to the base UB. The fourth inclined surface 172d may be in contact with the third inclined surface 172c. A boundary between the third inclined surface 172c and the fourth inclined surface 172d may correspond to or may be aligned with a boundary between the first inclined surface 172a and the second inclined surface 172b. For example, the boundary between the third inclined surface 172c and the fourth inclined surface 172d may be vertically aligned on the same line as the boundary between the first inclined surface 172a and the second inclined surface 172b.

The second angle θ2 may be greater than the first angle θ1. The third angle θ3 may be greater than the fourth angle θ4. The first inclined surface 172a may be longer than the second inclined surface 172b. The fourth inclined surface 172d may be longer than the third inclined surface 172c. The third inclined surface 172c may face the first inclined surface 172a, and the second inclined surface 172b may face the fourth inclined surface 172d.

Figure 28:
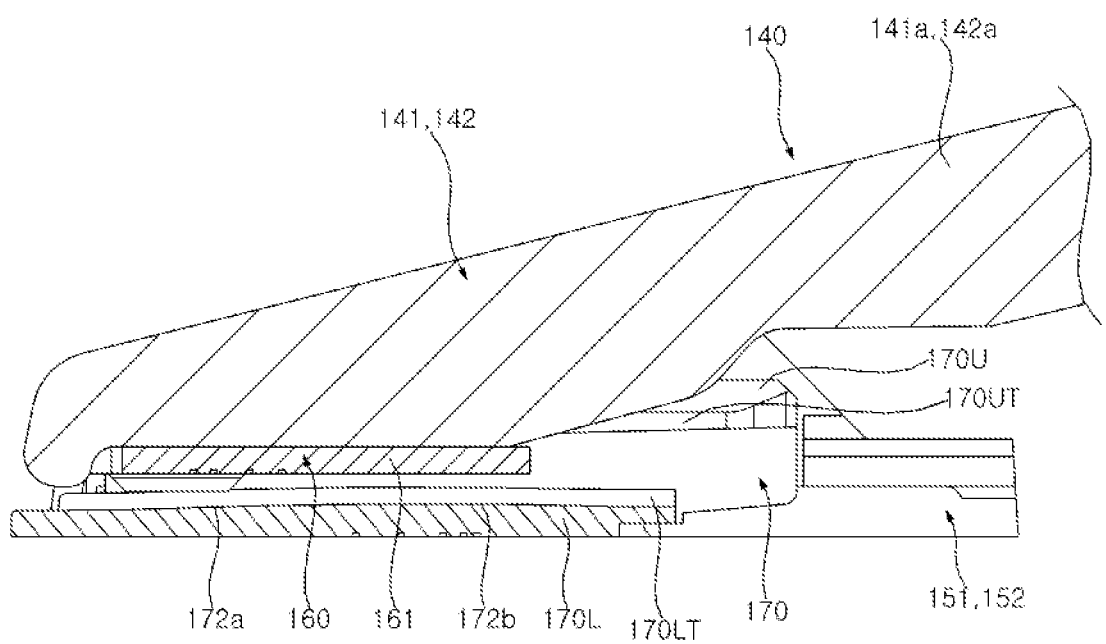

Referring to FIG. 28 along with FIG. 24, the slide bracket 160, to which the wing 140 is coupled, may be inserted into or coupled to the guide cover 170 and the sliding mounts 151 and 152. As the wings 151 and 152 move by pivoting about the driving module 130, the slide bracket 160 may move on the guide cover 170 in a longitudinal direction of the wing 140.

When the wing 140 causes the display panel 110 to change from flat to curved, the slide bracket 160 may move from the first inclined surface 172a to the second inclined surface 172b. When the wing 140 causes the display panel 110, which is curved with a predetermined curvature, to become flat, the slide bracket 160 may move from the second inclined surface 172b to the first inclined surface 172a.

Referring to FIG. 28 along with FIG. 25, while the wing 140 causes the display panel 110 to change from flat to curved, the front protrusion 163 of the slide bracket 160 may slide in contact with the lower trench 172LT. The front protrusion 163 may press and rub against the lower trench 172LT. The rear protrusion 162 may slide in contact with the upper trench 172UT or may slide while being supported by the upper trench 172UT.

While the wing 140 causes the display panel 110, which is curved with a predetermined curvature, to become flat, the front protrusion 163 of the slide bracket 160 may slide in contact with the lower trench 172LT or may slide while being supported by the lower trench 172LT. The rear protrusion 162 may slide in contact with the upper trench 172UT or may slide while being supported by the upper trench 172UT.

Accordingly, when the display panel 110 is curved, the display panel 110 curved with a predetermined curvature may have a constant curvature or a curvature close to the constant curvature.

Figure 29:
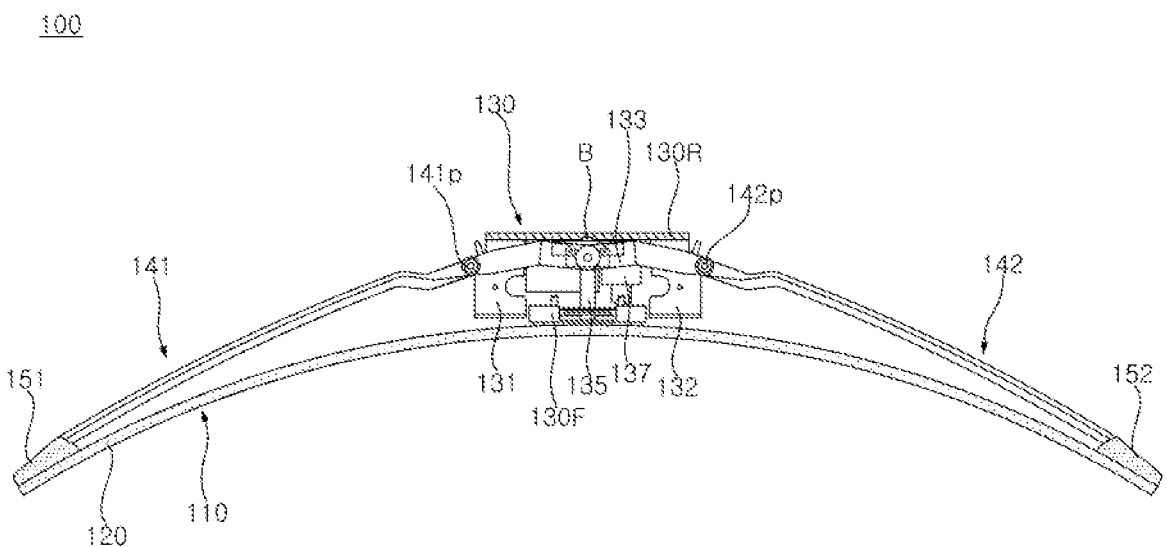

Referring to FIG. 29 along with FIG. 2, as the lead screw 135 is rotated by the torque provided by the motor 137, the flip frame 133 moves in a longitudinal direction of the lead screw 135, such that the wing 140 may pivot about the pivot shafts 141P and 142P.

When the wing 140 pivots, the slide bracket 160 moves on the sliding mounts 151 and 152 (see FIG. 24) and the guide cover 170 while pushing both short sides of the display panel 110 and the plate 120 to bend the display panel 110.

When the lead screw 135 is reversely rotated, the flip frame 133 moves in a reverse direction of the lead screw 135, such that the wing 140 may pivot about the pivot shafts 141P and 142P in an opposite direction.

When the wing 140 pivots in the opposite direction, the slide bracket 160 moves on the sliding mounts 151 and 152 and the guide cover 170 while pulling both short sides of the display panel 110 and the plate 120 to flatten the display panel 110.

Referring to FIGS. 1 to 29, a display device includes: a flexible display panel 110; a flexible plate 120 disposed at a rear of the display panel 110 and coupled to the display panel 110; a driving module 130 disposed at a rear of the plate 120 and including a moving block 134 that moves in a reciprocating motion on the lead screw 135 by rotation of the lead screw 135; wings 141 and 142 elongated with a first end coupled to the moving block 134 and a second end coupled to the rear of the plate 120, and having pivot shafts 141P and 142P disposed adjacent to the first end between the first end and the second end; wing brackets 131 and 132 connected with the pivot shafts 141P and 142P and fixed to the rear of the plate 120; and a first elastic member 102 having a first side supported by the wing brackets 131 and 132 and a second side supported by the wings 141 and 142 to push the wings 141 and 142 in one of moving directions of the moving block 134.

The wing brackets 131 and 132 may include: bracket frames 131a and 132a fixed to the rear of the plate 120; and wing holders 131b and 132b which protrude from one side of the bracket frames 131a and 132a and into which the pivot shafts 141P and 142P of the wings 141 and 142 are inserted, wherein the first side of the first elastic member 102 may be supported by the bracket frames 131a and 132a and the second side thereof may be supported by the wings 141 and 142.

The wings 141 and 142 may include: wing blades 141a and 142a formed between the second end and the pivot shafts 141P and 142P; levers 141c and 142c formed between the first end and the pivot shafts 141P and 142P; and necks 141b and 142b which are formed between the wing blades 141a and 142a and the levers 141c and 142c and in which the pivot shafts 141P and 142P are disposed, wherein the second side of the first elastic member 102 may make contact with the levers 141c and 142c of the wings 141 and 142.

The lever 142c may include a support groove 142c2 which is recessed inward; and a friction pad 142c1 protruding from the support groove 142c2 and having a surface which is smoothly polished, wherein the second side of the first elastic member 102 may make contact with the friction pad 142c1.

The moving block 134 may be screw-coupled to the lead screw 135, wherein when the lead screw 135 rotates in one direction, the moving block 134 may move forward on the lead screw 135, and when the lead screw 135 rotates in a direction opposite the one direction, the moving block 134 may move backward on the lead screw 135.

Clearance may be formed between the moving block 134 and the lead screw 135.

The display device may further include flip frames 133a and 133b connecting the moving block 134 and the wings 141 and 142, wherein the moving block 134 may include: a moving body 134a; a sliding block 134b coupled to an inside of the moving body 134a and screw-coupled to the lead screw 135; and a pivot pin 133c protruding from an outer surface of the moving body 134a, wherein the flip frames 133a and 133b may have a first side fixed to the wings 141 and 142 and a second side pivotally connected to the pivot pin 133c of the moving block 134.

The display device may further include a second elastic member 101 disposed between the wings 141 and 142 and the moving block 134 and having a first side fixed to the wings 141 and 142 and a second side making contact with the moving block 134.

The flip frames 133a and 133b may include holes 133H1 and 133H2 into which the pivot pin 133c of the moving block 134 is inserted, wherein clearance may be formed between the pivot pin 133c and the holes 133H1 and 133H2.

The second elastic member 101 may cause the pivot pin 133c of the moving block 134 to make contact with one side of the holes 133H1 and 133H2 of the flip frames 133a and 133b.

The flip frames 133a and 133b may be elongated from the wings 141 and 142 to the moving block 134, and the holes 133H1 and 133H2 may be long holes formed adjacent to distal ends of the flip frames 133a and 133b and having a major axis in a direction intersecting a longitudinal direction of the flip frames 133a and 133b.

The display device may further include an intermediate member 139 disposed between a pivot pin 133c of the moving block 134 and the holes 133H1 and 133H2 of the flip frames 133a and 133b and covering an outer surface of the pivot pin 133c, wherein the intermediate member 139 may be made of a low friction material.

The second elastic member 101 may include: a first part 101a having a plate shape and fixed to the wings 141 and 142; a second part 101b bent and extending from the first part 101a; and a third part 101c bent and extending from the second part 101b, facing the first part 101a, and supporting the moving block 134.

The display device may further include a support rib 101R protruding from an outer surface of the third part 101c, wherein the support rib 101R may make contact with the moving block 134.

The moving block 134 may be screw-coupled to the lead screw 135, wherein when the lead screw 135 rotates in one direction, the moving block 134 may move forward on the lead screw 135, and when the lead screw 135 rotates in a direction opposite the one direction, the moving block 134 may move backward on the lead screw 135.

Certain embodiments or other embodiments of the invention described above are not mutually exclusive or distinct from each other. Any or all elements of the embodiments of the invention described above may be combined or combined with each other in configuration or function.

For example, a configuration "A" described in one embodiment of the invention and the drawings and a configuration "B" described in another embodiment of the invention and the drawings may be combined with each other. Namely, although the combination between the configurations is not directly described, the combination is possible except in the case where it is described that the combination is impossible.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
a flexible display panel;
a flexible plate disposed at a rear of the display panel and coupled to the display panel;
a driving module disposed at a rear of the flexible plate and including a moving block that moves in a reciprocating motion on a lead screw by rotation of the lead screw;
wings elongated with a first end coupled to the moving block and a second end coupled to the rear of the flexible plate, and the wings includes pivot shafts disposed adjacent to the first end between the first end and the second end;
wing brackets connected with the pivot shafts and fixed to the rear of the flexible plate; and
a first elastic member including a first side supported by the wing brackets and a second side supported by the wings to push the wings in one of moving directions of the moving block;
flip frames connecting the moving block and the wings, wherein the wing brackets comprise:
bracket frames fixed to the rear of the flexible plate; and
wing holders which protrude from one side of the bracket frames and into which the pivot shafts of the wings are inserted,
wherein the first side of the first elastic member is supported by the bracket frames and the second side thereof is supported by the wings;
wherein the moving block comprises:
a moving body;
a sliding block coupled to an inside of the moving body and screw-coupled to the lead screw; and
a pivot pin protruding from an outer surface of the moving body,
wherein the flip frames have a first side fixed to the wings and a second side pivotally connected to the pivot pin of the moving block.

2. The display device of claim 1, wherein the wings comprise: wing blades formed between the second end and the pivot shafts;
levers formed between the first end and the pivot shafts; and
necks which are formed between the wing blades and the levers and in which the pivot shafts are disposed,
wherein the second side of the first elastic member contacting with the levers of the wings.

3. The display device of claim 2, wherein the lever comprises:
a support groove recessed inward; and
a friction pad protruding from the support groove and having a surface which is smoothly polished,
wherein the second side of the first elastic member contacts with the friction pad.

4. The display device of claim 1, wherein the moving block is screw-coupled to the lead screw,
wherein when the lead screw rotates in one direction, the moving block moves forward on the lead screw, and when the lead screw rotates in a direction opposite the one direction, the moving block moves backward on the lead screw.

5. The display device of claim 4, wherein clearance is formed between the moving block and the lead screw.

6. The display device of claim 1, further comprising a second elastic member disposed between the wings and the moving block and having a first side fixed to the wings and a second side contacting with the moving block.

7. The display device of claim 1, wherein the flip frames comprise holes into which the pivot pin of the moving block is inserted, wherein clearance is formed between the pivot pin and the holes.

8. The display device of claim 7, wherein the second elastic member provides the pivot pin of the moving block in contact with one side of the holes of the flip frames.

9. The display device of claim 7, wherein the flip frames are elongated from the wings to the moving block, and the holes are long holes formed adjacent to distal ends of the flip frames and having a major axis in a direction intersecting a longitudinal direction of the flip frames.

10. The display device of claim 7, further comprising an intermediate member disposed between a pivot pin of the moving block and the holes of the flip frames and covering an outer surface of the pivot pin,
wherein the intermediate member is made of a low friction material.

11. The display device of claim 8, wherein the second elastic member comprises:
a first part having a plate shape and fixed to the wings;
a second part bent and extending from the first part; and
a third part bent and extending from the second part, facing the first part, and supporting the moving block.

12. The display device of claim 11, further comprising a support rib protruding from an outer surface of the third part,
wherein the support rib is in contact with the moving block.

13. The display device of claim 1, wherein the moving block is screw-coupled to the lead screw,
wherein when the lead screw rotates in one direction, the moving block moves forward on the lead screw, and when the lead screw rotates in a direction opposite the one direction, the moving block moves backward on the lead screw.

* * * * *